United States Patent
Hayashi et al.

(10) Patent No.: US 9,000,437 B2
(45) Date of Patent: Apr. 7, 2015

(54) THIN-FILM SEMICONDUCTOR DEVICE INCLUDING A MULTI-LAYER CHANNEL LAYER, AND METHOD OF MANUFACTURING THE SAME

(75) Inventors: Hiroshi Hayashi, Osaka (JP); Takahiro Kawashima, Osaka (JP); Genshirou Kawachi, Chiba (JP)

(73) Assignees: Panasonic Corporation, Osaka (JP); Panasonic Liquid Crystal Display Co., Ltd., Hyogo (JP)

( * ) Notice: Subject to any disclaimer, the term of this patent is extended or adjusted under 35 U.S.C. 154(b) by 340 days.

(21) Appl. No.: 13/425,879

(22) Filed: Mar. 21, 2012

(65) Prior Publication Data

US 2013/0037806 A1 Feb. 14, 2013

Related U.S. Application Data

(63) Continuation of application No. PCT/JP2011/004503, filed on Aug. 9, 2011.

(51) Int. Cl.
*H01L 29/04* (2006.01)
*H01L 29/66* (2006.01)
*H01L 29/786* (2006.01)

(52) U.S. Cl.
CPC .... *H01L 29/66765* (2013.01); *H01L 29/78669* (2013.01); *H01L 29/78696* (2013.01); *H01L 29/04* (2013.01)

(58) Field of Classification Search
CPC .............. H01L 29/66765; H01L 29/04; H01L 29/78696; H01L 29/78669
USPC ......... 257/57, 59, E29.289, E29.29, E29.291, 257/E21.409, E29.273; 438/158
See application file for complete search history.

(56) References Cited

U.S. PATENT DOCUMENTS

| 6,794,682 B2 | 9/2004 | Watanabe et al. |
| 7,968,885 B2 | 6/2011 | Kobayashi et al. |
| 8,039,842 B2 | 10/2011 | Jinbo |

(Continued)

FOREIGN PATENT DOCUMENTS

| JP | 05-063196 | 3/1993 |
| JP | 2009-060096 | 3/2009 |

(Continued)

OTHER PUBLICATIONS

Hatzopoulos et al., "Stability of Amorphous-Silicon and Nancrystalline Silicon Thin-Film Transistors Under DC and AC Stress", IEEE Electron Device Letters, vol. 28, No. 9, Sep. 2007, pp. 803-805.

*Primary Examiner* — Peter Bradford
(74) *Attorney, Agent, or Firm* — Greenblum & Bernstein, P.L.C.

(57) ABSTRACT

A thin-film semiconductor device according to the present disclosure includes: a substrate; a gate electrode formed above the substrate; a gate insulating film formed on the gate electrode; a channel layer that is formed of a polycrystalline semiconductor layer on the gate insulating film; an amorphous semiconductor layer formed on the channel layer and having a projecting shape in a surface; and a source electrode and a drain electrode that are formed above the amorphous semiconductor layer, and a first portion included in the amorphous semiconductor layer and located closer to the channel layer has a resistivity lower than a resistivity of a second portion included in the amorphous semiconductor layer and located closer to the source and drain electrodes.

23 Claims, 16 Drawing Sheets

(56) References Cited

U.S. PATENT DOCUMENTS

| | | | |
|---|---|---|---|
| 2002/0192882 A1* | 12/2002 | Okumura | 438/149 |
| 2009/0039351 A1 | 2/2009 | Kobayashi et al. | |
| 2009/0095957 A1* | 4/2009 | Miyake et al. | 257/59 |
| 2009/0289256 A1 | 11/2009 | Jinbo | |
| 2009/0321743 A1 | 12/2009 | Isa et al. | |
| 2010/0148177 A1* | 6/2010 | Koyama et al. | 257/59 |
| 2011/0073863 A1* | 3/2011 | Asanuma et al. | 257/59 |
| 2011/0175091 A1 | 7/2011 | Kobayashi et al. | |
| 2011/0278583 A1 | 11/2011 | Hayashi et al. | |
| 2012/0021570 A1* | 1/2012 | Tajima et al. | 438/157 |

FOREIGN PATENT DOCUMENTS

| | | |
|---|---|---|
| JP | 2010-004027 | 1/2010 |
| JP | 2010-087471 | 4/2010 |
| JP | 2011-071440 | 4/2011 |

* cited by examiner

THIN-FILM SEMICONDUCTOR DEVICE INCLUDING A MULTI-LAYER CHANNEL LAYER, AND METHOD OF MANUFACTURING THE SAME

CROSS REFERENCE TO RELATED APPLICATION

This is a continuation application of PCT Patent Application No. PCT/JP2011/004503 filed on Aug. 9, 2011, designating the United States of America. The entire disclosure of the above-identified application, including the specification, drawings and claims is incorporated herein by reference in its entirety.

TECHNICAL FIELD

The present disclosure relates to a thin-film semiconductor device and a method of manufacturing the thin-film semiconductor device.

BACKGROUND ART

Conventionally, in an active-matrix display apparatus such as a liquid crystal display apparatus, a thin-film semiconductor device referred to as a thin film transistor (TFT) has been used. In the display apparatus, the TFT is used as a switching device for selecting a pixel or as a driving transistor for driving a pixel.

Recently, an organic electroluminescence (EL) display using electroluminescence (EL) of an organic material has been attracting attention as one of next-generation flat panel displays to replace the liquid crystal display. The organic EL display, unlike the liquid crystal display that is voltage-driven, is a current-driven device, so that it is urgently expected to develop a thin-film semiconductor device having an advantage in ON-OFF characteristics as the driving circuit for the active-matrix display apparatus.

Conventionally, as a thin-film semiconductor device for the driving circuit of the liquid crystal display, there is a thin-film semiconductor device in which an amorphous semiconductor layer, as a single layer, is used for a channel layer. This type of thin-film semiconductor device has a problem of low ON-current (drain current at the time of turning ON the gate) despite low OFF-current (leakage current at the time of turning OFF the gate), due to low charge mobility caused by a large bandgap of the channel layer.

To deal with this problem, for example, Non-Patent Reference 1 (Hatzopoulos et al., IEEE ELECTRON DEVICE LETTERS 28, 803 (2007)) discloses a thin-film semiconductor device in which the channel layer is formed in a two-layer structure consisting of a polycrystalline semiconductor layer and an amorphous semiconductor layer. By thus forming the channel layer into such a two-layer structure of the polycrystalline semiconductor layer and the amorphous semiconductor layer, it is considered that ideally, interaction between advantages of these two layers would increase the ON-current compared to the thin-film semiconductor device in which the channel layer is a single layer formed as an amorphous semiconductor layer, and such interaction would also decrease the OFF-current compared to the thin-film semiconductor device in which the channel layer is formed as a single polycrystalline semiconductor layer.

In addition, as the thin-film semiconductor device, there is a thin-film semiconductor device of a channel protection type (etching stopper type) that protects the channel layer from etching processing, but the thin-film semiconductor device of the channel protection type has a problem of a back channel being generated by a positive fixed charge in a channel protection film and accordingly generating a leakage current.

To deal with this problem, Patent Reference 1 (Japanese Unexamined Patent Application Publication No. 2011-71440) discloses a thin-film transistor of the channel protection type in which: a gate electrode, a gate insulating film, an active semiconductor film having a two-layer structure of a first semiconductor film (polycrystalline semiconductor layer) formed of microcrystalline silicon, polysilicon, and the like, and a second semiconductor film formed of amorphous silicon (amorphous semiconductor layer), and a back channel protection insulating film are serially formed above a substrate. The Patent Reference 1 discloses an effect of suppressing the back channel effect due to the fixed charge in the channel protection film.

CITATION LIST

Patent Literature

[Patent Literature 1]
Japanese Unexamined Patent Application Publication No. 2011-71440

Non Patent Literature

[Non Patent Literature 1]
Hatzopoulos et al., IEEE ELECTRON DEVICE LETTERS 28, 803 (2007)

SUMMARY OF INVENTION

Technical Problem

However, simply forming the channel layer into the two-layer structure consisting of the polycrystalline semiconductor layer and the amorphous semiconductor layer would not always allow decreasing an OFF current as well as increasing an ON current due to interaction of disadvantages between the polycrystalline semiconductor layer and the amorphous semiconductor layer.

Thus, the thin-film semiconductor device in which the channel layer has the two-layer structure of the polycrystalline semiconductor layer and the amorphous semiconductor layer has a problem of difficulty in achieving a balance between ON characteristics and OFF characteristics.

The present disclosure is conceived in view of the problem above, and it is an object of the present disclosure to provide a thin-film semiconductor device having an advantage in ON-OFF characteristics and a method of manufacturing the thin-film semiconductor device even for the thin-film semiconductor device in which a channel layer is formed in a stacked structure consisting of an amorphous semiconductor layer and a polycrystalline semiconductor layer.

Solution to Problem

To achieve the object described above, a thin-film semiconductor device according to an aspect of the present disclosure is a thin-film semiconductor device including: a substrate; a gate electrode formed above the substrate; a gate insulating film formed on the gate electrode; a channel layer formed of a polycrystalline semiconductor layer on the gate insulating film; an amorphous semiconductor layer formed on the channel layer and having a projecting portion in a surface thereof; and a source electrode and a drain electrode that are formed above the amorphous semiconductor layer, and a first portion included in the amorphous semiconductor layer and located closer to the channel layer has a resistivity lower than a resistivity of a second portion included in the amorphous semiconductor layer and located closer to the source electrode and the drain electrode.

Advantageous Effects of Invention

According to the present disclosure, in a thin-film semiconductor device in which the channel layer has a stacked structure of a polycrystalline semiconductor layer and an amorphous semiconductor layer, it is possible to realize a thin-film semiconductor device having an advantage in ON and OFF characteristics.

BRIEF DESCRIPTION OF DRAWINGS

These and other objects, advantages and features of the invention will become apparent from the following description thereof taken in conjunction with the accompanying drawings that illustrate a specific embodiment of the present disclosure. In the Drawings.

DESCRIPTION OF EMBODIMENT

Figure 1:
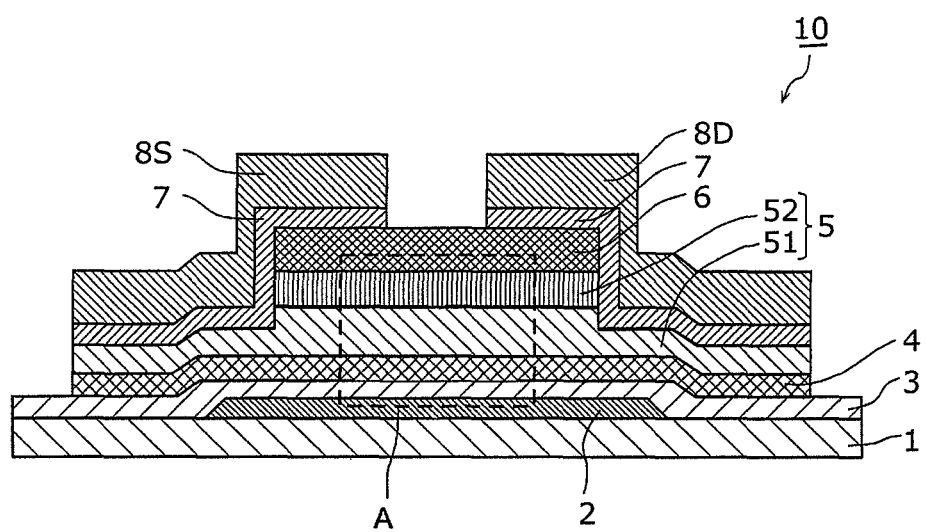
FIG. 1 is a cross-sectional view schematically showing a configuration of a thin-film semiconductor device according to an embodiment of the present disclosure.

A thin-film semiconductor device according to an aspect of the present disclosure is a thin-film semiconductor device including: a substrate; a gate electrode formed above the substrate; a gate insulating film formed on the gate electrode; a channel layer formed of a polycrystalline semiconductor layer on the gate insulating film; an amorphous semiconductor layer formed on the channel layer and having a projecting portion in a surface thereof; and a source electrode and a drain electrode that are formed above the amorphous semiconductor layer, and a first portion included in the amorphous semiconductor layer and located closer to the channel layer has a resistivity lower than a resistivity of a second portion included in the amorphous semiconductor layer and located closer to the source electrode and the drain electrode.

According to this aspect, the amorphous semiconductor layer on the polycrystalline semiconductor layer includes the first portion that is a layer having a relatively low resistance and the second portion that is a layer having a relatively high resistance, and furthermore the amorphous semiconductor layer has a projecting shape in the surface. This allows increasing transverse resistance in a back channel to suppress an OFF current, to thereby suppress the transverse resistance at the front channel to increase an ON current.

Furthermore, in the thin-film semiconductor device according to an aspect of the present disclosure, it is preferable that the first portion have an optical bandgap of 1.63 eV or more, and that the second portion have an optical bandgap of 1.60 eV or less.

This allows realizing a thin-film semiconductor device having an advantage in ON and OFF characteristics.

Furthermore, in the thin-film semiconductor device according to an aspect of the present disclosure, it is preferable that the first portion have a refractive index of 4.2 or less, and that the second portion have a refractive index of 4.3 or more.

This allows realizing a thin-film semiconductor device having an advantage in ON and OFF characteristics.

Furthermore, in the thin-film semiconductor device according to an aspect of the present disclosure, it is preferable that the first portion have an extinction coefficient of 0.11 or less, and that the second portion have an extinction coefficient of 0.12 or more.

This allows realizing a thin-film semiconductor device having an advantage in ON and OFF characteristics.

Furthermore, in the thin-film semiconductor device according to an aspect of the present disclosure, it is preferable that the first portion contain hydrogen at a concentration of 13% or more, and that the second portion contain hydrogen at a concentration of 9% or less.

This allows realizing a thin-film semiconductor device having an advantage in ON and OFF characteristics.

Furthermore, in the thin-film semiconductor device according to an aspect of the present disclosure, the amorphous semiconductor layer can be formed to have a stacked structure consisting of a layer corresponding to the second portion and a layer corresponding to the first portion, and the layer corresponding to the second portion can be formed on the layer corresponding to the first portion.

This allows configuring an amorphous semiconductor layer having a stacked structure.

Furthermore, in the thin-film semiconductor device according to an aspect of the present disclosure, the first portion can be formed of an amorphous semiconductor containing a microcrystal component, and the second portion can be formed of an amorphous semiconductor having a noncrystalline structure.

This allows forming the first portion having low resistance and the second portion having high resistance.

Furthermore, in the thin-film semiconductor device according to an aspect of the present disclosure, a portion at a bottom of each of sides of the projecting portion in the amorphous semiconductor layer can be formed to function as a charge transfer path between the channel layer and one of the source electrode and the drain electrode.

This allows reliably lowering the transverse resistance at the front channel.

Furthermore, the thin-film semiconductor device according to an aspect of the present disclosure may further include an insulating layer formed on a top surface of the projecting portion in the amorphous semiconductor layer.

Generally, the insulating layer includes a fixed charge, and the amorphous semiconductor layer is formed on the insulating layer. When the voltage applied to the amorphous semiconductor layer exceeds, due to this fixed charge, a threshold voltage for forming the back channel in an interface between the insulating layer and the amorphous semiconductor layer, back channel conduction occurs, so that the OFF current increases as leakage current. In contrast, according to the present disclosure, the surface of the amorphous semiconductor layer is formed in a projecting shape, and a projecting top portion of the amorphous semiconductor layer is the second portion having high resistance. This increases the threshold voltage for forming the back channel in the projecting top portion of the amorphous semiconductor layer and accordingly increases resistance, thus significantly suppressing transfer of the charge in the back channel that occurs between the source and drain electrodes via the projecting top portion of the amorphous semiconductor layer. As a result, the OFF current can be significantly reduced.

Furthermore, in the thin-film semiconductor device according to an aspect of the present disclosure, the insulating layer may have the same width as the top surface of the projecting portion in the amorphous semiconductor layer.

Furthermore, the thin-film semiconductor device according to an aspect of the present disclosure may further include a pair of contact layers formed on: a top surface and a side surface at each of end portions of the insulating layer; a side surface included in the projecting portion in the amorphous semiconductor layer and continuing from the side surface of the insulating layer; and the top surface included in the amorphous semiconductor layer and continuing from the side surface included in the projecting portion in the amorphous semiconductor layer, and the source electrode may be formed above one of the pair of contact layers, and the drain electrode may be formed above the other of the pair of contact layers.

Furthermore, in the thin-film semiconductor device according to an aspect of the present disclosure, the polycrystalline semiconductor layer may be made of polycrystalline silicon, and the amorphous semiconductor layer may be made of amorphous silicon.

Furthermore, in the thin-film semiconductor device according to an aspect of the present disclosure, the polycrystalline semiconductor layer may include a microcrystalline semiconductor layer having an average grain size of 20 nm or more and less than 40 nm.

Furthermore, in the thin-film semiconductor device according to an aspect of the present disclosure, the amorphous semiconductor layer may include a microcrystalline semiconductor layer having an average grain size of 20 nm or more and less than 40 nm.

Furthermore, in the thin-film semiconductor device according to an aspect of the present disclosure, the second portion in the amorphous semiconductor layer may have a film thickness of 20 nm or more, the second portion being located closer to the source electrode and the drain electrode.

By increasing the film thickness of the second portion having a relatively high resistance in the amorphous semiconductor layer, the voltage applied due to the fixed charge included in the insulating layer can be relaxed through the second portion in the amorphous semiconductor layer. This allows suppressing application of the voltage generated by the fixed charge included in the insulating layer to the first portion that is a layer having a relatively low resistance in the polycrystalline semiconductor layer or the amorphous semiconductor layer, thus allowing suppressing the leakage current by the back channel conduction in the first portion of the polycrystalline semiconductor layer or the amorphous semiconductor layer as well as increasing subthreshold characteristics (S value).

In addition, a method of manufacturing a thin-film semiconductor device according to an aspect of the present disclosure includes: preparing a substrate; forming a gate electrode above the substrate; forming a gate insulating film on the gate electrode; forming a channel layer on the gate insulating film, the channel layer being formed of a polycrystalline semiconductor layer; forming an amorphous semiconductor layer on the channel layer, the amorphous semiconductor layer having a projecting portion in a surface thereof; and forming a source electrode and a drain electrode above the amorphous semiconductor layer, and the amorphous semiconductor layer is formed such that a first portion located closer to the channel layer has a resistivity lower than a resistivity of a second portion located closer to the source electrode and the drain electrode.

Furthermore, in the method of manufacturing a thin-film semiconductor device according to an aspect of the present disclosure, the amorphous semiconductor layer may be formed on the polycrystalline semiconductor layer so that a crystal grain is mixed in the first portion in the amorphous semiconductor layer.

Furthermore, in the method of manufacturing a thin-film semiconductor device according to an aspect of the present disclosure, an average size of the crystal grain can be 20 nm or more and less than 40 nm.

Furthermore, the method of manufacturing a thin-film semiconductor device according to an aspect of the present disclosure, the amorphous semiconductor layer may be formed under the same forming condition so that the first portion and the second portion are continuously formed.

Furthermore, in the method of manufacturing a thin-film semiconductor device according to an aspect of the present disclosure, the first portion is formed under a first forming condition, and the second portion can be formed under a second forming condition different from the first forming condition.

Furthermore, in the method of manufacturing a thin-film semiconductor device according to an aspect of the present disclosure, it is preferable that the first forming condition be for further promoting crystal growth than in the second forming condition.

Furthermore, the method of manufacturing a thin-film semiconductor device according to an aspect of the present disclosure may, further include forming an insulating layer on a top surface of the projecting portion in the amorphous semiconductor layer, between the forming of an amorphous semiconductor layer and the forming of a source electrode and a drain electrode.

Embodiment

Hereinafter, a thin-film semiconductor device and a method of manufacturing the thin-film semiconductor device according to the present disclosure will be described based on the embodiment, but the present disclosure is specified by the descriptions in CLAIMS. Therefore, some constituent elements in the embodiment below are not essential for solving the problem of the present disclosure, but are described as elements constituting a preferred embodiment. Note that each figure is a schematic diagram and is not necessarily an exact illustration.

First, the configuration of a thin-film semiconductor device 10 according to the embodiment of the present disclosure will be described with reference to FIG. 1. FIG. 1 is a cross-sectional view schematically showing a configuration of a thin-film semiconductor device according to the embodiment of the present disclosure.

As shown in FIG. 1, the thin-film semiconductor device 10 according to the embodiment of the present disclosure is a bottom-gate thin-film transistor of a channel protection type and includes: a substrate 1; a gate electrode 2 formed above the substrate 1; a gate insulating film 3 formed on the gate electrode 2; a polycrystalline semiconductor layer 4 formed on the gate insulating film 3; an amorphous semiconductor layer 5 formed on the polycrystalline semiconductor layer 4; an insulating layer 6 formed on the amorphous semiconductor layer 5; and a source electrode 8S and a drain electrode 8D that are formed above the amorphous semiconductor layer 5 with the insulating layer 6 interposed therebetween. Furthermore, the thin-film transistor 10 according to the present embodiment includes, above the polycrystalline semiconductor layer 4, a pair of contact layers 7 formed between the amorphous semiconductor layer 5 and one of the source electrode 8S and the drain electrode 8D. Hereinafter, each constituent element in the thin-film transistor 10 according to the present embodiment will be described in detail.

The substrate 1 is a glass substrate made of a glass material, for example, silica glass, alkali-free glass, or high heat resistance glass, and so on. Note that in order to prevent impurities such as sodium and phosphorous included in the glass substrate from invading the polycrystalline semiconductor layer 4, an undercoat layer forming of a silicon nitride film ($SiN_x$), silicon oxide film ($SiO_y$), or silicon oxide nitride film ($SiO_yN_x$), or the like may be formed on the substrate 1. In addition, the undercoat layer, in some cases, plays a role to mitigate the influence of heat on the substrate during a process of high temperature heat treatment such as laser annealing. The film thickness of the undercoat layer may be, for example, approximately 100 nm to 2000 nm.

The gate electrode 2 is patterned into a predetermined form above the substrate 1. The gate electrode 2 can be formed into a single-layer structure or a multilayer structure using a conductive material, an alloy thereof, and so on, and can be formed using, for example: molybdenum (Mo), aluminum (Al), copper (Cu), tungsten (W), titanium (Ti), chrome (Cr), molybdenum-tungsten (MoW), and the like. The film thickness of the gate electrode 2 can be, for example, approximately 20 nm to 500 nm.

The gate insulating film 3 is formed on the gate electrode 2, and is formed, according to the present embodiment, to cover the gate electrode 2 across the entire surface of the substrate 1. The gate insulating film 3, for example, may be formed of a single layer film or a stacked film that is formed of, for example, silicon oxide ($SiO_y$), silicon nitride ($SiN_x$), silicon oxide nitride ($SiO_yN_x$), aluminum oxide ($AlO_z$), and tantalum oxide ($TaO_w$). The film thickness of the gate insulating film 3 can be, for example, 50 nm to 300 nm.

Note that in the present embodiment, since the polycrystalline semiconductor layer 4 is included as the channel layer, it is preferable to use silicon oxide as the gate insulating film 3. This is because it is preferable to form an interface state between the polycrystalline semiconductor layer 4 and the gate insulating film 3 in a satisfactory state so as to maintain satisfactory threshold voltage characteristics in the thin-film semiconductor device, and silicon oxide is appropriate for this purpose.

The polycrystalline semiconductor layer 4 is a first channel layer formed on the gate insulating film 3, and includes a predetermined channel region that is a region in which the carrier transfer is controlled by the voltage of the gate electrode 2. The polycrystalline semiconductor layer 4 is formed of a crystalline silicon thin film having a crystalline structure, and is formed of polycrystalline silicon according to the present embodiment.

The polycrystalline semiconductor layer 4 can be formed by, for example, crystallizing amorphous silicon. An average grain size of the crystalline silicon in the polycrystalline semiconductor layer 4 is approximately 5 nm to 1000 nm, and the polycrystalline semiconductor layer 4 is made not only of the polycrystalline silicon having an average grain size of approximately 100 nm or more but may also be in mixed crystals of polycrystalline silicon and microcrystalline silicon that is referred to as microcrystal (μc) having an average grain size of 200 nm or more to below 400 nm. In this case, to obtain satisfactory ON characteristics, it is preferable that at least the channel region in the polycrystalline semiconductor layer 4 be formed of a film having a high ratio of polycrystalline silicon. Note that the film thickness of the polycrystalline semiconductor layer 4 can be, for example, approximately 20 nm to 100 nm.

The amorphous semiconductor layer 5 is a second channel layer formed on the polycrystalline semiconductor layer 4, and has a projecting shape (projecting portion) and a flat shape (flat portion) in the surface. The amorphous semiconductor layer 5 includes: a first portion 51 that is a portion closer to a polycrystalline semiconductor layer 4 and is included in the amorphous semiconductor layer 5, and a second portion 52 that is a portion closer to the source electrode 8S and the drain electrode 8D and is included in the amorphous semiconductor layer 5. The first portion 51 constitutes a base portion and the flat portion in the amorphous semiconductor layer 5, and is formed in contact with a top surface of the polycrystalline semiconductor layer 4. In addition, the second portion 52 constitutes the top portion of the projecting portion in the amorphous semiconductor layer 5, and is formed on the base portion of the first portion 51.

Furthermore, the amorphous semiconductor layer 5 is formed such that the resistivity of the portion closer to the polycrystalline semiconductor layer 4 side is relatively low compared to the resistivity of the portion closer to the source electrode 8S and the drain electrode 8D. In other words, the first portion 51 is a low resistance layer having a smaller resistivity than the second portion 52. Conversely, the second portion 52 is a high resistance layer having a higher resistivity than the first portion 51. Thus, the amorphous semiconductor layer 5 according to the present embodiment is formed in a stacked structure consisting of a low resistance layer corresponding to the first portion 51 and a high resistance layer corresponding to the second portion 52. Note that the amorphous semiconductor layer 5 is not limited to the stacked structure but may be a single-layer structure including the first portion 51 and the second portion 52.

According to the present embodiment, each of the first portion and the second portion 52 is formed of an amorphous semiconductor layer made of amorphous silicon, but they are different in film quality. The first portion 51 is an amorphous semiconductor layer (amorphous silicon) including a microcrystalline semiconductor layer (microcrystalline silicon) having a grain size of 20 nm or more and less than 400 nm. On the other hand, the second portion 52 is an amorphous semiconductor layer (amorphous silicon) having an amorphous structure that does not include a microcrystalline semiconductor layer. Note that generally, the film structure of the amorphous silicon film is formed only of a non-crystalline amorphous component; however, in some cases, the film structure of the amorphous silicon film according to the present embodiment includes a microcrystalline crystalline component, and includes an amorphous silicon film including mixed crystals in which the crystalline component is included in the amorphous component (noncrystalline component). According to the present embodiment, the first portion 51 is an amorphous silicon film having mixed crystals.

The first portion 51 thus structured is partially crystallized, and the crystallinity in a thickness direction gradually increases toward the polycrystalline semiconductor layer 4. Specifically, the size of the crystalline silicon grain in the first portion 51 gradually increases toward the polycrystalline semiconductor layer 4. Here, crystallinity is a degree of crystallization in the structure of the silicon semiconductor film in the case of, for example, the semiconductor film mainly composed of silicon, and can be represented by, for example, a size of the crystal grain as described above or a level of density and so on in the same crystal grain size. In addition, the crystallinity can be represented by crystallinity only by the crystalline component, or crystallinity only by the non-crystalline component (amorphous component). Thus, the amorphous silicon in the first portion 51 is partially crystallized to have a lower resistance. Note that the second portion 52 is an amorphous silicon film that is not crystallized. In addition, in the present embodiment, the first portion 51 and the second portion 52 are formed of an amorphous silicon film (intrinsic amorphous silicon) not purposely doped with impurities.

Furthermore, in the amorphous semiconductor layer 5, the film thickness of the flat portion is smaller than the film thickness of the projecting portion (height of the projecting portion). In the present embodiment, the flat portion is formed by removing the second portion 52 at both end portions of the amorphous semiconductor layer to form both end portions of the amorphous semiconductor layer 5 into thinner films, and as a result, the remaining portion that is not removed is formed as the projecting portion. In addition, the projecting portion (the second portion 52) in the amorphous semiconductor layer 5 is located above the gate electrode 2, and both ends of the projecting portion (the second portion 52) are located inside the both ends of the gate electrode 2. In other words, the gate electrode 2 has a longer gate length (channel length) than a gate length direction of the projecting portion (the second portion 52) of the amorphous semiconductor layer 5. With this, a portion at the bottom of each side of the projecting portion (the second portion 52) of the amorphous semiconductor layer 5, that is, the flat portion (the first portion 51) of the amorphous semiconductor layer 5 on the gate electrode 2 becomes a path for the charge transfer between one of the source electrode 8S and the drain electrode 8D and the channel region in the polycrystalline semiconductor layer 4. Thus, the region included in the amorphous semiconductor layer 5 and located above the gate electrode 2 is the channel region formed as thin films.

Note that for the film thickness of the amorphous semiconductor layer 5, for example, a total difference in film thickness between the film thicknesses of the projecting portion and the flat portion can be approximately 5 nm or more, the film thickness of the projecting portion can be approximately 20 nm to 100 nm, and the film thickness of the flat portion can be approximately 10 nm to 90 nm. In the present embodiment, it is assumed that the projecting portion has a film thickness of 40 nm and the flat portion has a film thickness of 20 nm.

The insulating layer 6 is a channel protection layer that protects the channel layer (the polycrystalline semiconductor layer 4 and the amorphous semiconductor layer 5), and functions as a channel etching stopper (CES) layer for preventing the amorphous semiconductor layer 5 from being etched in etching processing for forming the pair of contact layers 7. The insulating layer 6 is formed on the second portion 52 that is projecting in shape in the amorphous semiconductor layer 5. In the present embodiment, the insulating layer 6 is formed only on the projecting top surface of the amorphous semiconductor layer 5. Here, the insulating layer 6 has the same width as a width of the top surface of the upper portion (the second portion 52) of the projecting portion of the amorphous semiconductor layer 5, and the side surface of the insulating layer 6 and the side surface of the projecting portion of the amorphous semiconductor layer 5 are formed to be flush with each other. Note that the width of the insulating layer 6 and the width of the projecting portion of the amorphous semiconductor layer 5 are a width in an alignment direction of the source electrode 8S and the drain electrode 8D, that is, a width in a charge conduction direction.

In addition, the insulating layer 6 is an organic material layer that is formed using an organic material, which mainly includes an organic material including silicon, oxygen, and carbon, or is an inorganic material layer that is formed using an inorganic material such as silicon oxide ($SiO_x$) or silicon nitride ($SiN_y$). Note that the insulating layer 6 has insulation properties, so that the pair of contact layers 7 are not electrically connected to each other.

In the case of forming the insulating layer 6 formed of the organic material layer, it is possible to form the insulating layer 6 by patterning and solidifying a photosensitive coat-type organic material. In this case, the organic material for forming the insulating layer 6 includes, for example, an organic resin material, a surfactant, a solvent, and a photosensitizer; for the organic resin material that is a main component of the insulating layer 6, it is possible to use a photosensitive or non-photosensitive organic resin material composed of one or more types of: polyimide, acryl, polyamide, resist, benzocyclobutene, and so on. For the surfactant, a surfactant including a silicon compound such as siloxane can be used. For the solvent, an organic solvent such as propyleneglycol monomethylether acetate, 1,4-dioxane, and so on can be used. In addition, for the photosensitizer, a positive-type photosensitizer such as naphthoquinone diazide can be used. Note that the photosensitizer includes not only carbon but also sulfur. In the case of forming the insulating layer 6 formed of the organic material layer, it is possible to form the organic material as described above using a coating method such as spin coating. In forming the insulating layer 6 using the organic material, it is possible to use not only the coating method but also another method such as a droplet discharge method. For example, it is possible to selectively form an organic material in a predetermined shape, using a printing method that allows forming a predetermined pattern such as screen printing or offset printing.

Here, the film thickness of the insulating layer 6 is, for example, 300 nm to 1000 nm. A lower limit of the film thickness of the insulating layer 6 is determined in terms of margin considering channel etching and suppressing an influence of the fixed charge in the insulating layer, and an upper limit of the film thickness of the insulating layer 6 is determined in terms of suppressing a decrease in reliability of the process involved in an increase in steps.

The pair of contact layers 7 are formed of amorphous semiconductor films having a high impurity concentration, and is formed above the polycrystalline semiconductor layer 4 and the amorphous semiconductor layer 5 via the insulating layer 6. Each of the pair of contact layers 7 is, for example, an n-type semiconductor layer in which amorphous silicon is doped with phosphorous (P) as impurities and is an n$^+$-layer including a high concentration of impurities at $1\times10^{19}$ [atm/cm$^3$] or higher.

The pair of contact layers 7 are provided opposite each other at a predetermined interval on the insulating layer 6, and each of the pair of the contact layers 7 is formed to cover an area from the top surface of the insulating layer 6 to the flat portion of the amorphous semiconductor layer 5. Specifically, each of the two contact layers 7 is provided at an either end portion of the projecting portion of the amorphous semiconductor layer 5, and is formed in: a top and a side surface of the insulating layer 6; a side surface of the projecting portion (the second portion 52 and the first portion 51) included in the amorphous semiconductor layer 5 and continuing into the side surface of the insulating layer 6; and a top surface of the flat portion (the first portion 51) included in the amorphous semiconductor layer 5 and continuing into the side surface of the projecting portion of the amorphous semiconductor layer 5. Note that the film thickness of the contact layers 7 can be, for example, 5 nm to 100 nm.

Note that the pair of contact layers 7 may be formed of two layers: a field relaxing layer (n$^-$ layer) that is a lower layer having a low concentration, and a contact layer (n$^+$ layer) that is an upper layer having a high concentration. The field relaxing layer having a low concentration is doped with phosphorous of approximately $1\times10^{17}$(atm/cm$^3$). The two layers described above can be continuously formed in a chemical vapor deposition (CVD) apparatus.

A pair of the source electrode 8S and the drain electrode 8D are provided opposite each other at a predetermined interval above the polycrystalline semiconductor layer 4 and the amorphous semiconductor layer 5, and are formed on the pair of contact layers 7 to be flush with the pair of contact layers 7. The source electrode 8S is formed on and along one of the contact layers 7, and the drain electrode 8D is formed on and along the other of the contact layers 7.

Specifically, the pair of the source electrode 8S and the drain electrode 8D are formed, via the contact layer 7, along: top and side surfaces of both end portions of the insulating layer; a side surface of the projecting portion (the second portion 52 and the first portion 51) included in the amorphous semiconductor layer 5 and continuing into the side surface of the insulating layer 6; and the top portion included in the flat portion (the first portion 51) and continuing into the side surface of the projecting portion of the amorphous semiconductor layer 5.

In the present embodiment, each of the source electrode 8S and the drain electrode 8D can be formed into a single layer structure or a multilayer structure formed of a conductive material or an alloy of such material and so on, and for example, is formed of a material such as aluminum (Al), molybdenum (Mo), tungsten (W), copper (Cu), titanium (Ti), or chrome (Cr). In the present embodiment, the source electrode 8S and the drain electrode 8D are formed in a trilayer structure of MoW/Al/MoW. Note that the film thickness of the source electrode 8S and the drain electrode 8D can be, for example, approximately 100 nm to 500 nm.

Figure 2A:
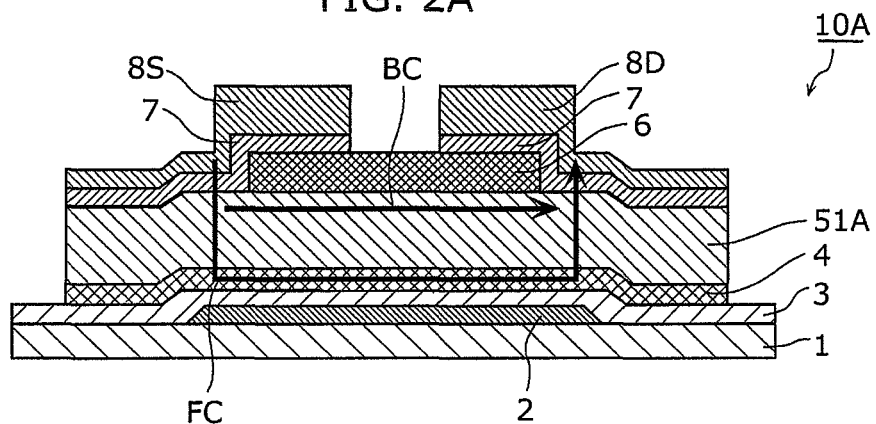
FIG. 2A is a cross-sectional view schematically showing a configuration and an operation of a thin-film semiconductor device according to a first comparative example of the present disclosure.
Figure 2B:
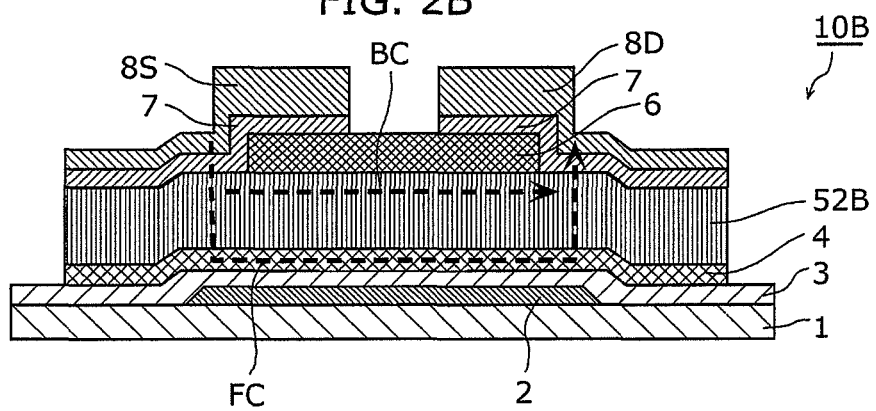
FIG. 2B is a cross-sectional view schematically showing a configuration and an operation of a thin-film semiconductor device according to a second comparative example of the present disclosure.
Figure 2C:
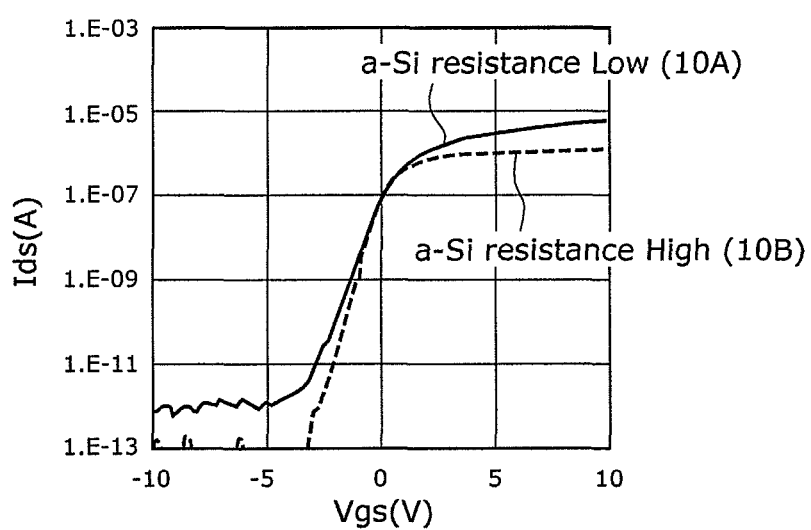
FIG. 2C is a diagram showing a relationship between a drain current (Ids) and a source-gate voltage (Vgs) in the thin-film semiconductor device shown in FIGS. 2A and 2B.
Figure 3:
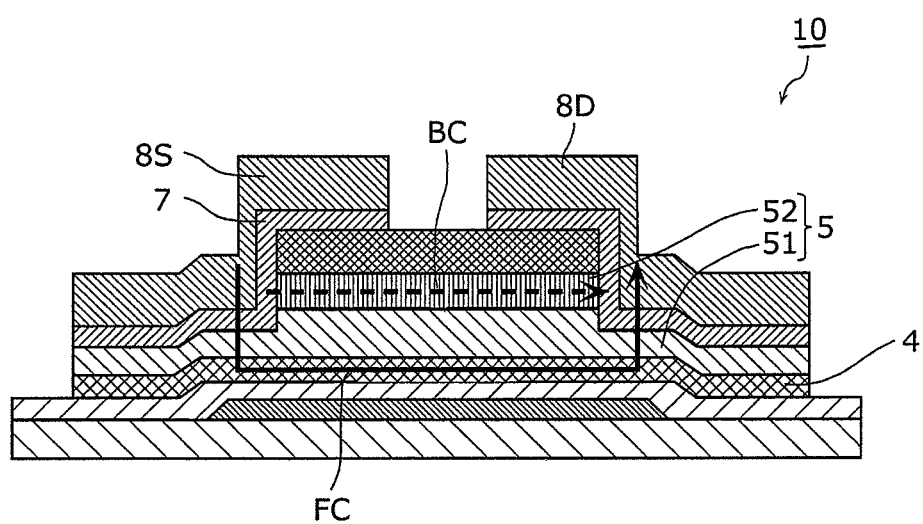
FIG. 3 is a cross-sectional view schematically showing an operation of the thin-film semiconductor device according to the embodiment of the present disclosure.

Next, an advantageous effect of the thin-film semiconductor device 10 thus configured according to the present embodiment will be described with reference to FIGS. 2A, 2B, and 2C and FIG. 3, including the context leading to the present disclosure. FIG. 2A is a cross-sectional view schematically showing a configuration and an operation of a thin-film semiconductor device according to a first comparative example. FIG. 2B is a cross-sectional view schematically showing a configuration and an operation of a thin-film semiconductor device according to a second comparative example. FIG. 2C is a diagram showing a relationship between a drain current (Ids) and a source-gate voltage (Vgs) in the thin-film semiconductor device shown in FIGS. 2A and 2B. FIG. 3 is a cross-sectional view schematically showing a configuration of the thin-film semiconductor device according to the embodiment of the present disclosure. Note that in FIGS. 2A and 2B and FIG. 3, the same constituent element as shown in FIG. 1 is assigned with the same reference sign.

In the thin-film semiconductor device in which the channel layer has a stacked structure consisting of a polycrystalline semiconductor layer and an amorphous semiconductor layer, in the case of a thin-film semiconductor device 10A using, as the amorphous semiconductor layer, an amorphous semiconductor layer 51A made of a low-resistance amorphous silicon having a low resistivity, the transverse resistance at the front channel FC can be reduced as shown in FIGS. 2A and 2C, thus making it possible to increase the ON current. On the other hand, in this case, the transverse resistance in a back channel BC is also reduced, so that the OFF current increases. Particularly, in the thin-film semiconductor device of the channel protection type, there is a positive fixed charge in the insulating layer that is to function as the channel protection layer. Moreover, in the case of forming a coated-type channel protection layer (insulating layer) using an organic material, the channel layer includes more positive fixed charges than in the case of forming the channel protection layer formed using an inorganic material such as SiO$_2$. For this reason, when a voltage applied to the amorphous semiconductor layer 51A by this fixed charge exceeds a threshold voltage for forming the back channel in the interface between the insulating layer 6 and the amorphous semiconductor layer 5, back channel conduction occurs, and the OFF current increases as leakage current.

On the other hand, in the thin-film semiconductor device in which the channel layer has a stacked structure consisting of the polycrystalline semiconductor layer and the amorphous semiconductor layer, in the case of a thin-film semiconductor device 10B using, as the amorphous semiconductor layer, an amorphous semiconductor layer 52B made of a high-resistance amorphous silicon having a high resistivity as shown in FIG. 2B, the transverse resistance in the back channel BC can be increased as shown in FIGS. 2B and 2C, thus making it possible to reduce the OFF current. On the other hand, in this case, since the transverse resistance at the front channel FC also increases, the On current is reduced.

Thus, in the thin-film semiconductor device in which the channel layer has a stacked structure consisting of the polycrystalline semiconductor layer and the amorphous semiconductor layer, since the ON current and the OFF current have a trade-off relationship, it has been difficult to achieve a balance between the ON and OFF characteristics.

In contrast, as shown in FIG. 3, the thin-film semiconductor device 10 according to the embodiment of the present disclosure, the amorphous semiconductor layer 5 on the polycrystalline semiconductor layer 4 is formed into a two-layer structure consisting of the first portion 51 that is a low-resistance layer and the second portion 52 that is a high-resistance layer, and furthermore a surface of the amorphous semiconductor layer 5 is formed into a projecting shape such that a length in the gate length direction of the second portion 52 is smaller than a length in the gate length direction of the gate electrode 2. With this, the flat portion (the first portion 51) in the amorphous semiconductor layer 5 above the gate electrode 2 becomes a path for charge transfer between one of the source electrode 8S and the drain electrode 8D and the channel region in the polycrystalline semiconductor layer 4.

Thus, in the thin-film semiconductor device 10 according to the present embodiment, the second portion 52 having a high resistance is provided in an interface layer (the amorphous semiconductor layer 5) with the insulating layer 6 in which the leakage current flows as a result of generation of the back channel BC. Since this allows increasing the transverse resistance in the back channel BC, it is possible to suppress the OFF current.

Furthermore, in the thin-film semiconductor device 10 according to the present embodiment, not a high-resistance amorphous semiconductor layer (the second portion 52) but only a low-resistance amorphous semiconductor layer (the first portion 51) is provided at the front channel FC. Since this allows decreasing the transverse resistance at the front channel, it is possible to increase the ON current.

Thus, with the thin-film semiconductor device 10 according to the embodiment of the present disclosure, it is possible to achieve a balance between the ON and OFF characteristics.

Particularly, since the thin-film semiconductor device 10 according to the present embodiment is a thin-film semiconductor device of the channel protection type including the insulating layer 6, a leakage current is likely to be generated by back channel generated by the fixed charge in the insulating layer 6. In contrast, according to the present embodiment, the surface of the amorphous semiconductor layer 5 is formed into a projecting shape, and the top portion in the projecting shape of the amorphous semiconductor layer 5 is formed as the second portion 52 having a high resistivity. This increases the threshold voltage for forming the back channel in the projecting top portion of the amorphous semiconductor layer and accordingly increases resistance, thus significantly suppressing the charge transfer of the back channel between the source and drain electrodes via the projecting top portion of the amorphous semiconductor layer 5. As a result, it is possible to significantly decrease the OFF current.

Next, a preferable film quality condition for the first portion 51 and the second portion 52 in the amorphous semiconductor layer 5 in the thin-film semiconductor device according to the embodiment of the present disclosure will be described with reference to FIGS. 4, 5, 6A, 6B, and 6C. FIGS. 4, 5, 6A, and 6B show: respectively, in the thin-film semiconductor device in which the channel layer is formed in a stacked structure of the polycrystalline semiconductor layer and the amorphous semiconductor layer, a diagram showing a relationship between ON resistance and OFF current; a diagram showing a relationship between the optical bandgap and the ON resistance of the amorphous semiconductor layer; a diagram showing a relationship between the extinction coefficient and the optical bandgap of the amorphous semiconductor layer; a diagram showing a relationship between the refractive index and the optical bandgap of the amorphous semiconductor layer; and a diagram showing a relationship between the hydrogen concentration and the optical bandgap of the amorphous semiconductor layer.

Figure 4:
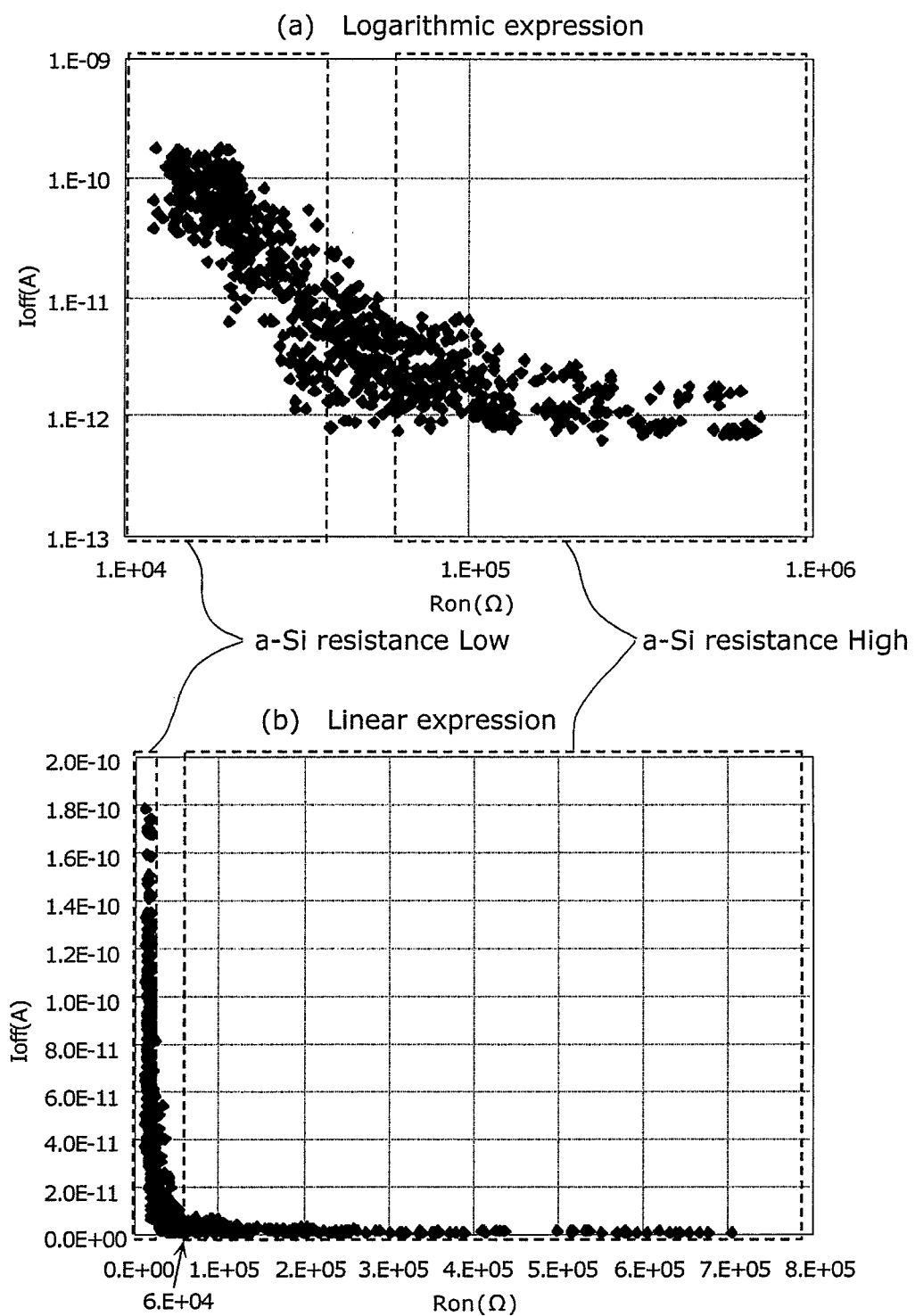
FIG. 4 is a diagram showing a relationship between ON resistance and OFF current in the thin-film semiconductor device in which a channel layer is formed in a stacked structure of a polycrystalline semiconductor layer and an amorphous semiconductor layer.

FIG. 4 shows, in the thin-film semiconductor device in which the channel layer is formed in a stacked structure of the polycrystalline semiconductor layer (polycrystalline silicon) and the amorphous semiconductor layer (amorphous silicon), plotted ON resistance and OFF current in each thin-film semiconductor device in the case of actually manufacturing a plurality of thin-film semiconductor devices by changing only the condition for forming the amorphous semiconductor layer without changing the plane pattern or cross-sectional structure. In the thin-film semiconductor device in which the channel layer is formed in a stacked structure of the polycrystalline semiconductor layer and the amorphous semiconductor layer, it is shown that ON characteristics and OFF characteristics have a trade-off relationship.

(a) in FIG. 4 shows a logarithmic expression thereof, and as shown in (a) in FIG. 4, when changing the resistivity of the amorphous semiconductor layer from high resistance to low resistance, the OFF current starts increases at $6.0 \times 10^4$ [Ω]. This means that the crystalline component included in the amorphous semiconductor layer starts increasing, to accordingly increase the crystallinity in the amorphous semiconductor layer.

In addition, as shown in (a) in FIG. 4, even by increasing the crystalline component included in the amorphous semiconductor layer to change the resistivity toward low resistance, plot points are found clustered near the ON resistance of $1.7 \times 10^4$ [Ω], showing that the decrease of the ON resistance has peaked. This means that: even by increasing the crystalline component included in the amorphous semiconductor layer to increase the crystallinity in the amorphous semiconductor layer, a resistance component other than the amorphous semiconductor layer in the thin-film semiconductor device has started controlling ON resistance. In other words, the resistance of the amorphous semiconductor layer has become much lower than the resistance component of the amorphous semiconductor layer included in the thin-film semiconductor device.

In addition, (b) in FIG. 4 shows a replacement of (a) in FIG. 4 by linear expression; as shown in (b) in FIG. 4, the ON resistance and OFF current rapidly change at $6.0 \times 10^4$ [Ω]. Specifically, the quality of the amorphous semiconductor layer clearly differs between a region in which the quality of the amorphous semiconductor layer indicates high resistance and a region in which the quality indicates low resistance.

Note that in FIG. 4, ON resistance Ron indicates a value of resistance of the thin-film semiconductor device when source-drain voltage Vds=0.1 V, and source-gate voltage Vgs=15 V. In addition, OFF current Ioff indicates a current value of the thin-film semiconductor device when Vds=5 V, Vgs=−11V.

Figure 5:
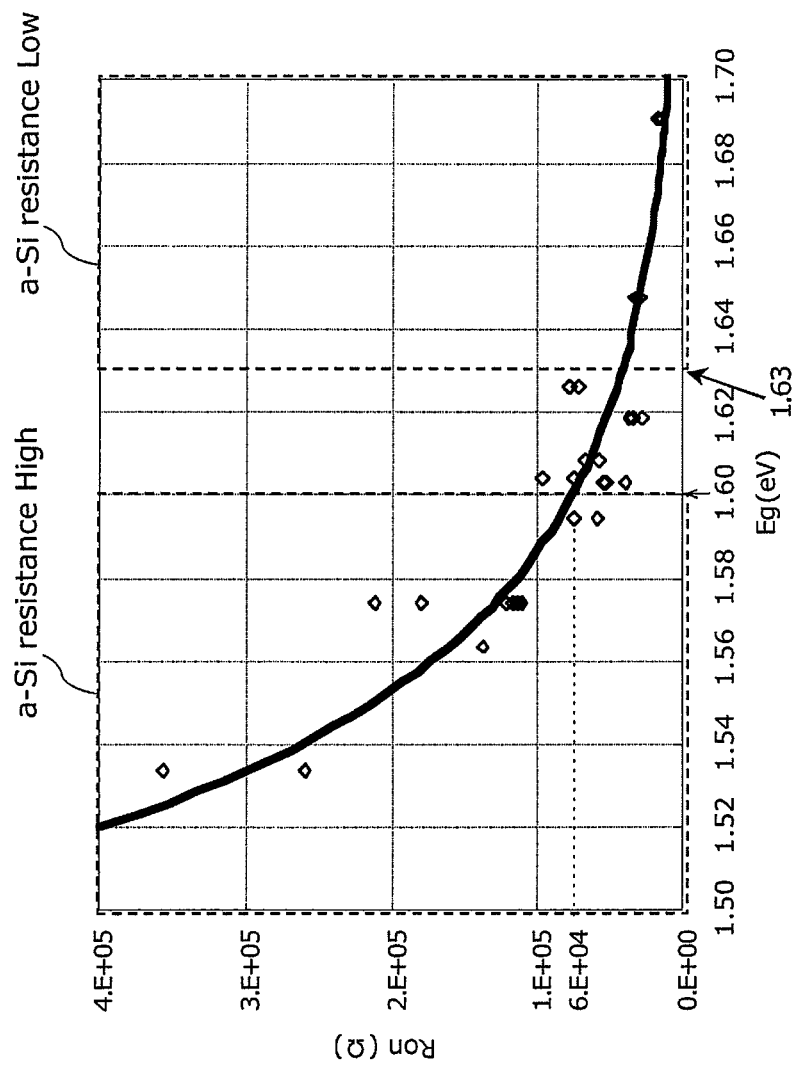
FIG. 5 is a diagram showing a relationship between an optical bandgap and an ON resistance of the amorphous semiconductor layer, in the thin-film semiconductor device in which a channel layer is formed in a stacked structure of a polycrystalline semiconductor layer and an amorphous semiconductor layer.

As described above, in the thin-film semiconductor device thus manufactured, since it is preferable that the ON resistance be $6.0 \times 10^4$ [Ω] or more in order to obtain the thin-film semiconductor device having a small OFF current, it is preferable, as shown in FIG. 5, that the optical bandgap Eg of the amorphous semiconductor layer be 1.60 [eV] or less. Accordingly, it is preferable to set, to 1.60 [eV] or less, the optical bandgap of the first portion 51 of the amorphous semiconductor layer 5 in the thin-film semiconductor device 10 according to the embodiment of the present disclosure.

In addition, considering that the optical bandgap levels off near ON resistance $1.7 \times 10^4$ [Ω] of the manufactured thin-film semiconductor device as shown in (a) in FIG. 4, it is preferable, as shown in FIG. 5, that the bandgap Eg for the low-resistance amorphous semiconductor layer be set to 1.63 [eV]

or more. Accordingly, it is preferable to set, to 1.63 [eV] or more, the optical bandgap of the second portion 52 of the amorphous semiconductor layer 5 in the thin-film semiconductor device 10 according to the embodiment of the present disclosure.

Note that in FIG. 5, the ON resistance Ron indicates the resistance value of the thin-film semiconductor device when Vds=0.1 V, Vgs=15 V.

Thus, in the amorphous semiconductor layer 5 in the thin-film semiconductor device 10 according to the present embodiment, it is preferable to set the optical bandgap of the first portion 51 to 1.60 [eV] or less, and set the optical bandgap of the second portion 52 to 1.63 [eV] or more.

Figure 6A:
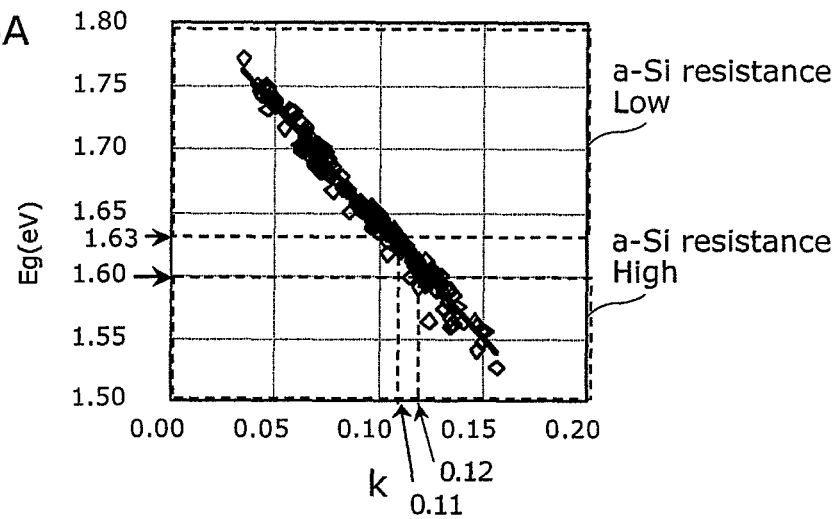
FIG. 6A is a diagram showing a relationship between an extinction coefficient and an optical bandgap of the amorphous semiconductor layer, in the thin-film semiconductor device in which a channel layer is formed in a stacked structure of a polycrystalline semiconductor layer and an amorphous semiconductor layer.
Figure 6B:
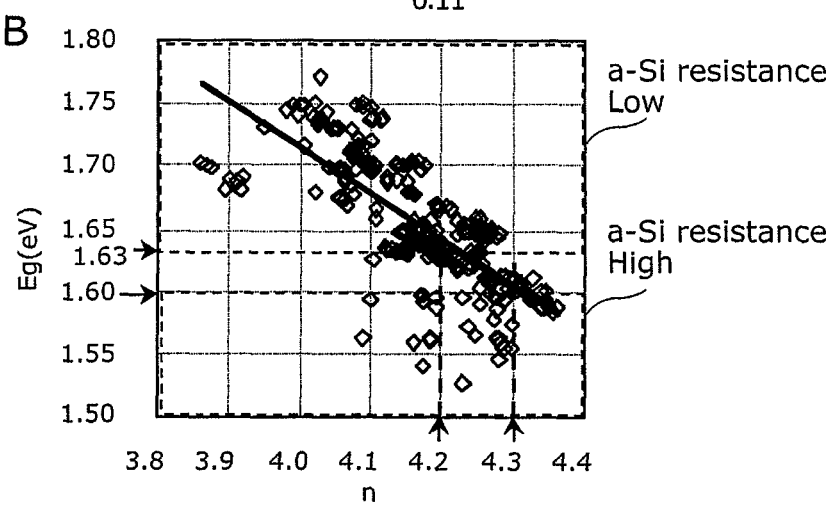
FIG. 6B is a diagram showing a relationship between a refractive index and an optical bandgap of the amorphous semiconductor layer, in the thin-film semiconductor device in which a channel layer is formed in a stacked structure of a polycrystalline semiconductor layer and an amorphous semiconductor layer.
Figure 6C:
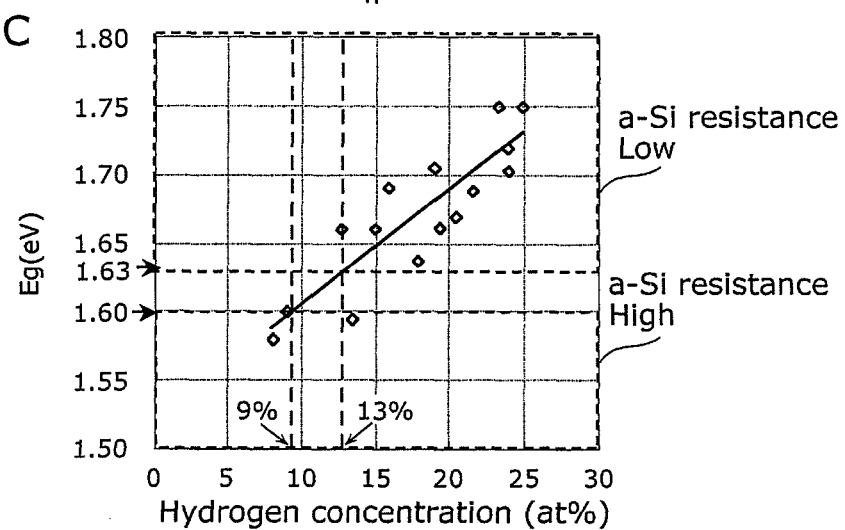
FIG. 6C is a diagram showing a relationship between a hydrogen concentration and an optical bandgap of the amorphous semiconductor layer, in the thin-film semiconductor device in which a channel layer is formed in a stacked structure of a polycrystalline semiconductor layer and an amorphous semiconductor layer.

Accordingly, as shown in FIG. 6A, it is preferable that an extinction coefficient k of the first portion 51 be 0.11 or less, and the extinction coefficient k of the second portion 52 be 0.12 or more. In addition, as shown in FIG. 6B, it is preferable that a refractive index n of the first portion 51 be 4.2 or less, and the refractive index n of the second portion 52 be 4.3 or more. In addition, as shown in FIG. 6C, it is preferable that the concentration of hydrogen content in the first portion 51 be 13% or more, and the concentration of hydrogen content of the second portion 52 be 9% or less.

Figure 7A:
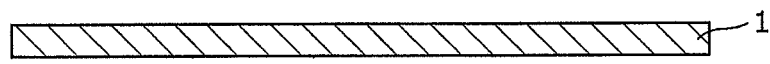
FIG. 7A is a cross-sectional view schematically showing a process of preparing a substrate in a method of manufacturing a thin-film semiconductor device according to an embodiment of the present disclosure.

Next, the method of manufacturing the thin-film semiconductor device 10 according to the embodiment of the present disclosure will be described with reference to FIGS. 7A to 7O. FIG. 7A to 7O are cross-sectional views each of which schematically shows a configuration of the thin-film semiconductor device in each process in the method of manufacturing the thin-film semiconductor device according to the embodiment of the present disclosure.

First, as shown in FIG. 7A, the substrate 1 is prepared. As the substrate 1, for example, a glass substrate can be used. Note that in advance of forming the gate electrode 2, the undercoat layer including the silicon nitride film, the silicon oxide film, and the silicon oxide nitride film may be formed on the substrate 1 by plasma CVD and so on.

Figure 7B:
FIG. 7B is a cross-sectional view schematically showing a process of forming a gate electrode in the method of manufacturing a thin-film semiconductor device according to the embodiment of the present disclosure.

Next, as shown in FIG. 7B, the gate electrode 2 having a predetermined shape is formed above the substrate by patterning. For example, a gate metal film including molybdenum-tungsten (MoW) is formed across the entire surface of the substrate 1 by sputtering, and the gate metal film thus formed is patterned into the gate electrode 2 having the predetermined shape by photolithography and wet etching. MoW can be wet-etched using, for example, a chemical in which phosphoric acid ($HPO_4$), nitric acid ($HNO_3$), acetic acid ($CH_3COOH$) and water are mixed at a predetermined composition.

Figure 7C:
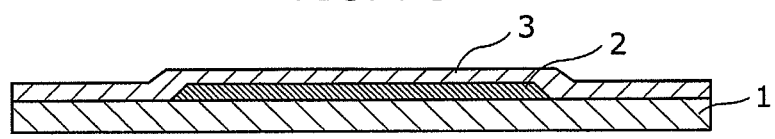
FIG. 7C is a cross-sectional view schematically showing a process of forming a gate insulating film in the method of manufacturing a thin-film semiconductor device according to the embodiment of the present disclosure.

Next, as shown in FIG. 7C, the gate insulating film 3 is formed above the substrate 1. For example, the gate insulating film 3 is formed using silicon oxide by plasma CVD and so on, across the entire surface above the substrate 1 to cover the gate electrode 2. The silicon oxide can be formed into a film by, for example, introducing silane gas ($SiH_4$) and nitrous oxide gas ($N_2O$) at a predetermined concentration ratio.

Figure 7D:
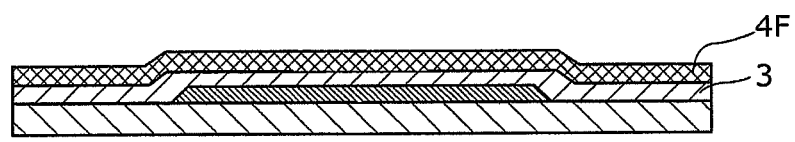
FIG. 7D is a cross-sectional view schematically showing a process of forming a polycrystalline semiconductor layer in the method of manufacturing a thin-film semiconductor device according to the embodiment of the present disclosure.

Next, as shown in FIG. 7D, a polycrystalline semiconductor layer 4F is formed using polycrystalline silicon, on the gate insulating film 3. In this case, first, a noncrystalline silicon thin film is formed using, for example, amorphous silicon, on the gate insulting film 3 by plasma CVD and so on, and the polycrystalline semiconductor layer 4F can be formed by crystallizing the noncrystalline silicon thin film by annealing after performing dehydrogenation annealing treatment. Note that the noncrystalline silicon thin film can be formed by, for example, introducing silane gas ($SiH_4$) and hydrogen gas ($H_2$) at a predetermined concentration ratio.

Note that according to the present embodiment, the noncrystalline silicon thin film has been crystallized by laser annealing using an excimer laser; however, the crystallization method may also be: a laser annealing method using a pulse laser having a wavelength of approximately 370 nm to 900 nm; a laser annealing method using a continuous wave laser having a wavelength of approximately 370 nm to 900 nm; or an annealing method by rapid thermal processing (RTP). In addition, the polycrystalline semiconductor layer 4F can be formed not by crystallizing the noncrystalline silicon thin film but by another method such as direct growth by the CVD.

Subsequently, by performing hydrogen plasma processing on the polycrystalline semiconductor layer 4F, hydrogenation processing is performed on silicon atoms in the polycrystalline semiconductor layer 4F. The hydrogen plasma processing is performed by generating hydrogen plasma by radiofrequency (RF) electricity using, as a base material, for example, gas including hydrogen gas such as $H_2$ and $H_2$/argon (Ar). This hydrogen plasma processing hydrogen-terminates a dangling bond (defect) in the silicon atom, thus reducing the crystal defect density of the polycrystalline semiconductor layer 4F to increase crystallinity.

Figure 7E:
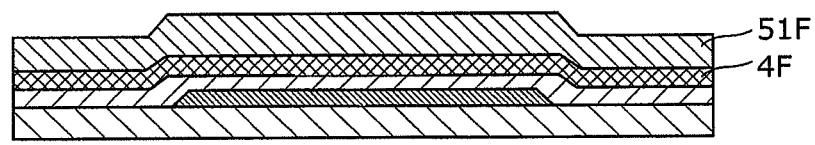
FIG. 7E is a cross-sectional view schematically showing a process of forming a first amorphous semiconductor layer in the method of manufacturing a thin-film semiconductor device according to the embodiment of the present disclosure.

Next, as shown in FIG. 7E, on the polycrystalline semiconductor layer 4F, a first amorphous semiconductor layer 51F is formed as a layer corresponding to the first portion 51 that is a low-resistance layer. For example, after forming the polycrystalline semiconductor layer 4F, the first amorphous semiconductor layer 51F including a low-resistance amorphous silicon film is formed using the plasma CVD and so on in accordance with a first film forming condition (first forming condition) that is predetermined.

For example, it is possible to obtain a partially-crystallized amorphous silicon film by introducing silane gas ($SiH_4$) and hydrogen gas ($H_2$) at a predetermined concentration ratio using a parallel-plate RF plasma CVD apparatus, and forming the film with settings: silane gas flow at 60 sccm; hydrogen gas flow at 10 sccm; pressure 5 Torr; RF power density at 0.17 $W \cdot cm^{-2}$; substrate temperature 275° C.; and inter-electrode distance at 13.3 mm. This allows forming a low-resistance first amorphous semiconductor layer 51F having a lower resistivity than the resistivity of the second amorphous semiconductor layer that is to be formed next.

Figure 7F:
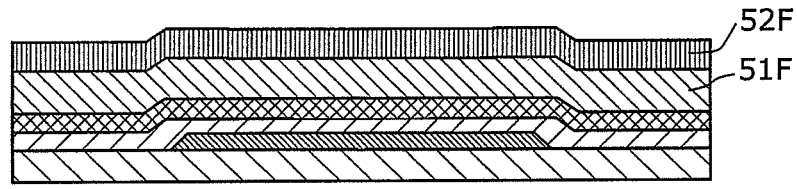
FIG. 7F is a cross-sectional view schematically showing a process of forming a second amorphous semiconductor layer in the method of manufacturing a thin-film semiconductor device according to the embodiment of the present disclosure.

Next, as shown in FIG. 7F, the second amorphous semiconductor layer 52F as a layer corresponding to the second portion 52 that is a high-resistance layer is formed on the first amorphous semiconductor layer 51F. For example, after forming the first amorphous semiconductor layer 51F, the second amorphous semiconductor layer 52F is formed of amorphous silicon film by the plasma CVD and so on in accordance with a second film forming condition (second forming condition) that is predetermined.

The second film forming condition for forming the second amorphous semiconductor layer 52F is different from the first film forming condition for forming the first amorphous semiconductor layer 51F. The first film forming condition is a condition for further promoting crystal growth of the amorphous semiconductor layer than the second film forming condition.

Specifically, it is possible to obtain an amorphous silicon film formed only of an amorphous silicon component, by introducing silane gas ($SiH_4$) and hydrogen gas ($H_2$) at a predetermined concentration ratio using the parallel-plate RF plasma CVD apparatus, and forming the film with settings: silane gas flow at 10 sccm, hydrogen gas flow at 250 sccm, pressure 3 Torr; RF power density at 1.1 $W \cdot cm^{-2}$; substrate temperature 275° C.; and inter-electrode distance at 7.6 mm. This allows forming a high-resistance second amorphous semiconductor layer 52F having a higher resistivity than the resistivity of the first amorphous semiconductor layer 51F.

Thus, according to the present embodiment, in the case of forming the two amorphous semiconductor layers 5 that are different in resistivity, it is preferable that the first film forming condition for forming the first amorphous semiconductor layer 51F that is the lower layer be different from the second film forming condition for forming the second amorphous semiconductor layer 52F, and the first film forming condition is a condition for further promoting the crystal growth of the amorphous semiconductor layer than in the second film forming condition.

Note that in the case of forming the two amorphous semiconductor layers 5 different in resistivity, by switching the film forming condition during the formation of the amorphous silicon, from the first film forming condition to the second film forming condition, it is possible to continuously form the first amorphous semiconductor layer 51F and the second amorphous semiconductor layer 52F.

In addition, in the present embodiment, it is preferable to continuously form the first amorphous semiconductor layer 51F and the second amorphous semiconductor layer 52F in the same vacuum apparatus. This allows suppressing unevenness in the formed film between elements in the first amorphous semiconductor layer 51F and the second amorphous semiconductor layer 52F, thus realizing the thin-film semiconductor device fitted to a large panel.

Figure 7G:
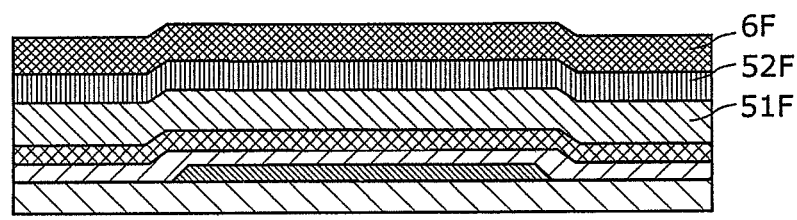
FIG. 7G is a cross-sectional view schematically showing a process of forming a film for forming an insulating layer in the method of manufacturing a thin-film semiconductor device according to the embodiment of the present disclosure.

Next, as shown in FIG. 7G, an insulating layer forming film 6F for forming the insulating layer 6 is formed on the second amorphous semiconductor layer 52F. For the insulating layer forming film 6F, an organic material or an inorganic material can be used.

Figure 7H:
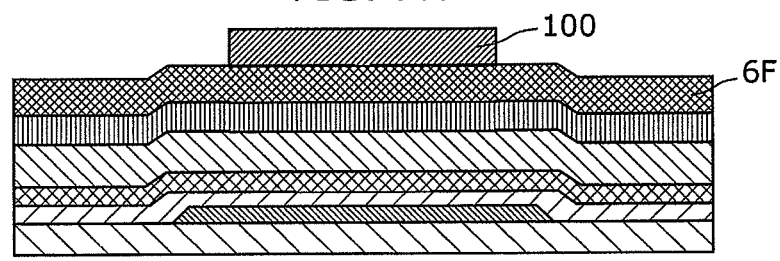
FIG. 7H is a cross-sectional view schematically showing a process of forming a resist in the method of manufacturing a thin-film semiconductor device according to the embodiment of the present disclosure.
Figure 7I:
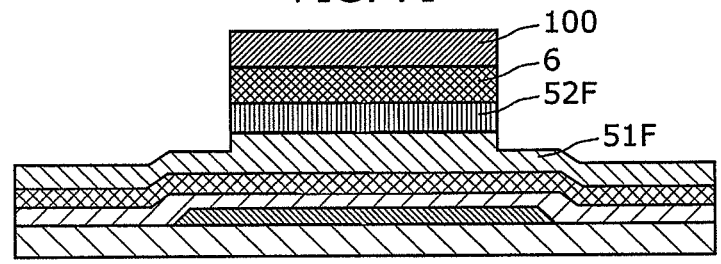
FIG. 7I is a cross-sectional view schematically showing a process of forming a projecting portion (etching process) in the method of manufacturing a thin-film semiconductor device according to the embodiment of the present disclosure.
Figure 7J:
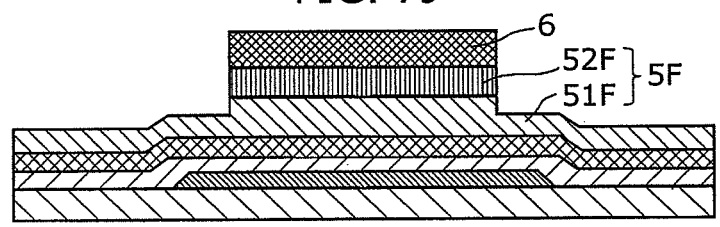
FIG. 7J is a cross-sectional view schematically showing a process of forming the projecting portion (resist removing process) in the method of manufacturing a thin-film semiconductor device according to the embodiment of the present disclosure.

For example, in the case of forming the insulating layer forming film 6F using an inorganic material such as silicon oxide, as shown in FIG. 7H, a resist 100 having a predetermined width is formed on the insulating layer forming film 6F, as a photomask to define a portion in which the insulating layer 6 having a predetermined shape is to be formed (the projecting portion of the amorphous semiconductor layer 5). Subsequently, as shown in FIG. 7I, by performing dry etching using the resist 100 as a mask, the insulating layer 6 having a predetermined shape is formed by patterning the insulating layer forming film 6F, and the amorphous semiconductor layer 5F having a projecting shape (projecting portion) and a flat shape (flat portion) is formed at the same time by patterning a stacked layer consisting of the second amorphous semiconductor layer 52F and the first amorphous semiconductor layer 51F. Next, as shown in FIG. 7J, the resist 100 formed on the insulating layer 6 on the projecting portion of the amorphous semiconductor layer 5 (the second amorphous semiconductor layer 52F) is removed. With this, the top surface of the insulating layer 6 is exposed.

On the other hand, in FIG. 7G, in the case of forming the insulating film forming film 6F made of an organic material on the second amorphous semiconductor layer 52F by a predetermined coating method, for example, by applying an organic material such as photosensitive Spin-on glass (SOG) to the second amorphous semiconductor layer 52F and performing spin coating and slit coating, it is not necessary to form the resist 100 as shown in FIG. 7H, and the insulating layer 6 having a predetermined shape can be formed through exposure, development, and baking of the insulating layer forming film 6F. Subsequently, by performing dry etching as in FIG. 7I using the insulating layer 6 as a mask, the stacked film of the second amorphous semiconductor layer 52F and the first amorphous semiconductor layer 51F are patterned, so that the amorphous semiconductor layer 5F having the projecting shape (projecting portion) and the flat shape (flat portion) as shown in FIG. 7J can be formed.

In any case, the second amorphous semiconductor layer 52F corresponding to the insulating layer 6 is formed as the projecting portion, and at the same time, the first amorphous semiconductor layer 51F is exposed to be formed into the flat portion as a portion corresponding to a region in which the second amorphous semiconductor layer 52F is removed.

Figure 7K:
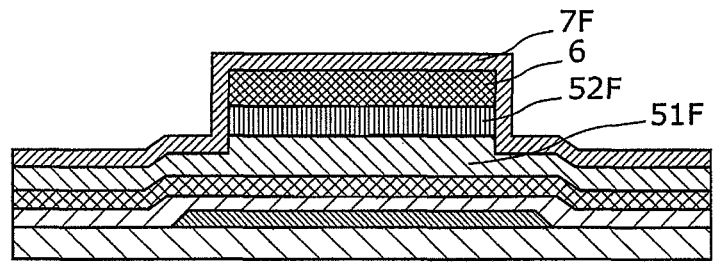
FIG. 7K is a cross-sectional view schematically showing a process of forming a film for a contact layer in the method of manufacturing a thin-film semiconductor device according to the embodiment of the present disclosure.

Next, as shown in FIG. 7K, a contact layer film 7F that is to be the contact layer 7 is formed on the second amorphous semiconductor layer 52F, to cover the insulating layer 6. Specifically, the contact layer film 7F including amorphous silicon doped with a pentad impurity such as phosphorous is formed by the plasma CVD, to cover an area from the top surface of the insulating layer 6 to the flat portion of the amorphous semiconductor layer 52F.

Note that the contact layer film 7F may be formed of two layers: a field relaxing layer having a low concentration and a contact layer having a high concentration. The field relaxing layer having a low concentration can be formed by doping with phosphorous of approximately $1 \times 10^{17}$ [atm/cm$^3$]. The two layers described above can be continuously formed in the CVD apparatus.

Figure 7L:
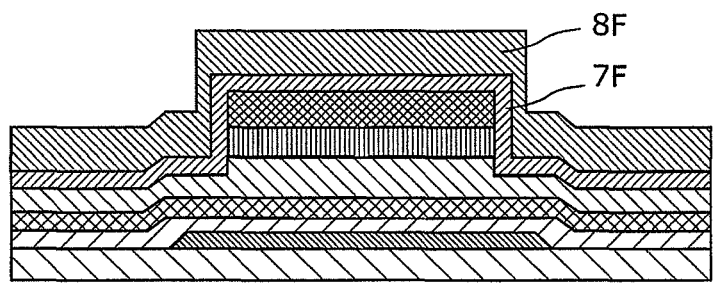
FIG. 7L is a cross-sectional view schematically showing a process of forming a source-drain metal film in the method of manufacturing a thin-film semiconductor device according to the embodiment of the present disclosure.

Next, as shown in FIG. 7L, a source-drain metal film 8F including the source electrode 8S and the drain electrode 8D is formed to cover the contact layer film 7F. For example, the source-drain metal film 8F having a trilayer structure of MoW/Al/MoW is formed by sputtering.

Subsequently, although not shown, in order to form the source electrode 8S and the drain electrode 8D having a predetermined shape, a resist material is applied on the source-drain metal film 8F to form a resist patterned in a predetermined shape by exposure and development.

Figure 7M:
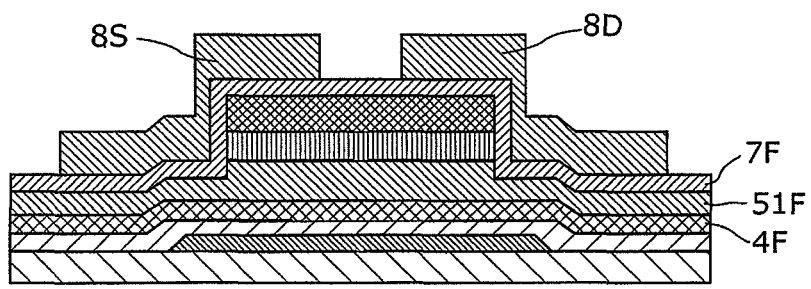
FIG. 7M is a cross-sectional view schematically showing a process of forming a source electrode and a drain electrode in the method of manufacturing a thin-film semiconductor device according to the embodiment of the present disclosure.

Next, by patterning the source-drain metal film 8F through wet etching using this resist as a mask, the source electrode 8S and the drain electrode 8D having a predetermined shape are formed as shown in FIG. 7M. Note that the contact layer film 7F at this time functions as an etching stopper. Subsequently, the resist on the source electrode 8S and the drain electrode 8D is removed.

Figure 7N:
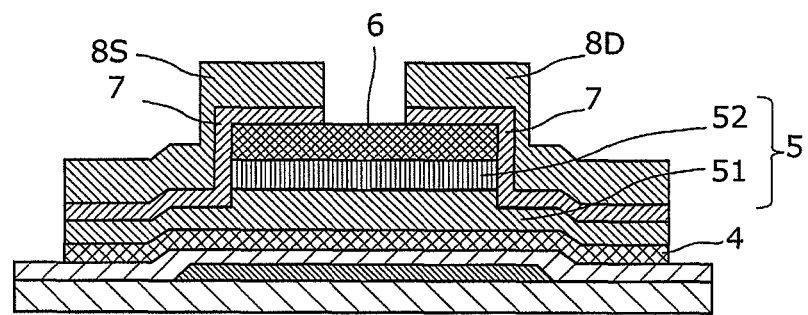
FIG. 7N is a cross-sectional view schematically showing a process of patterning the contact layer and the channel layer (islandization process) in the method of manufacturing a thin-film semiconductor device according to the embodiment of the present disclosure.
Figure 7O:
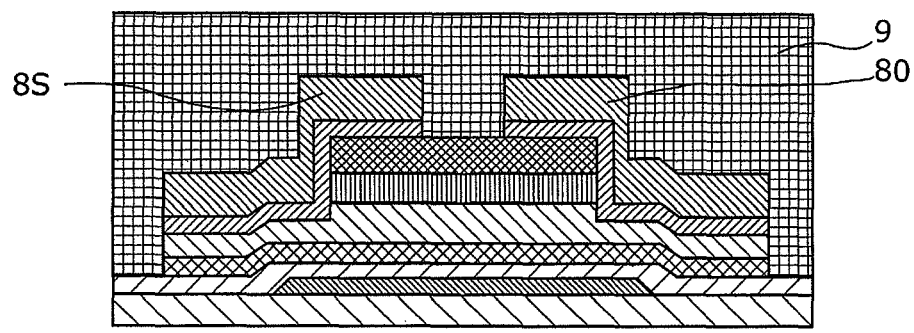
FIG. 7O is a cross-sectional view schematically showing a process of forming a passivation film in the method of manufacturing a thin-film semiconductor device according to the embodiment of the present disclosure.

Next, as shown in FIG. 7N, by performing dry etching using the source electrode 8S and the drain electrode 8D as masks, the contact layer film 7F is patterned to be formed into the pair of contact layers 7, and at the same time the first amorphous semiconductor layer 51F and the polycrystalline semiconductor layer 4F are patterned into an island shape to form the amorphous semiconductor layer 5 and the polycrystalline semiconductor layer 4 having a predetermined shape, thus allowing forming the channel layer that includes the polycrystalline semiconductor layer 4 and the amorphous semiconductor layer 5 that consists of the first portion 51 and the second portion 52. Note that as the condition for the dry etching, chlorine gas can be used. Thus, the thin-film semiconductor device 10 according to the embodiment of the present disclosure can be manufactured.

Note that subsequently, as shown in FIG. 7O, a passivation film 80 including an inorganic material such as SiN may be formed to cover an entire surface of the source electrode 8S and the drain electrode 8D.

Figure 8:
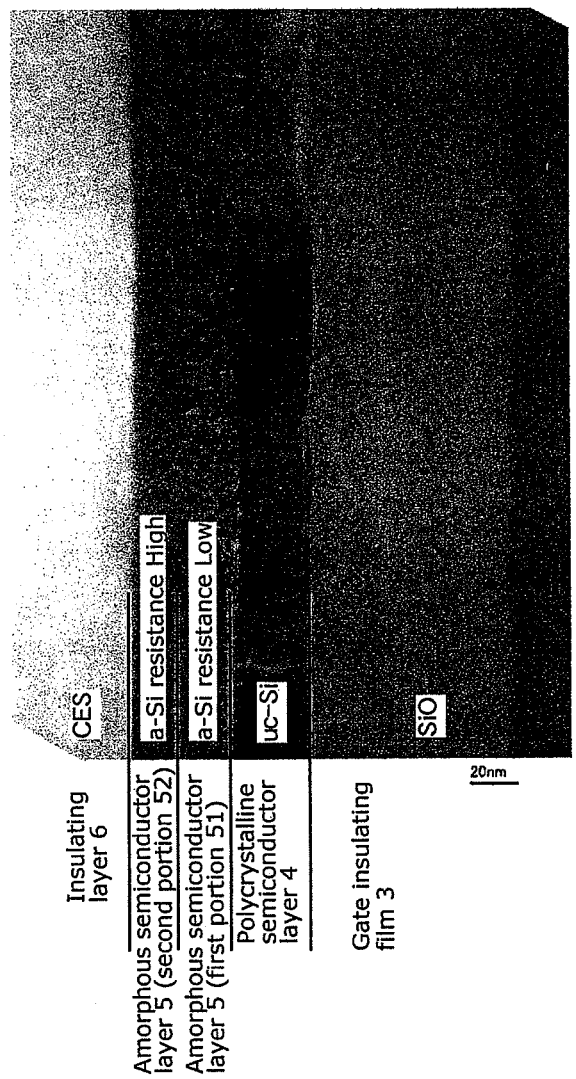
FIG. 8 is a cross-sectional transmission electron microscope (TEM) image of a cross section, when observed through a transmission electron microscope (TEM), of the thin-film semiconductor device according to the embodiment of the present disclosure.

Here, a cross-sectional structure of the film structure of the thin-film semiconductor device 10 according to the present embodiment, which is actually manufactured according to the method above, will be described with reference to FIG. 8. FIG. 8 is a cross-sectional TEM image of a cross section of the thin-film semiconductor device according to the embodiment of the present disclosure when the cross section thereof is observed. Note that FIG. 8 is a cross-sectional TEM image corresponding to Region A surrounded by a dashed line in FIG. 1.

As shown in FIG. 8, it is clear that the amorphous semiconductor layer 5 formed on the polycrystalline semiconductor layer 4 made of polycrystalline silicon consists of a low-resistance layer that is the first portion 51 including amorphous silicon having a crystalline component and a high-resistance layer that is the second portion 52 including amorphous silicon formed only of an amorphous component.

Figure 9A:
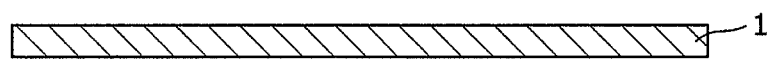
FIG. 9A is a cross-sectional view schematically showing a process of preparing a substrate in the method of manufacturing a thin-film semiconductor device according to a variation of the embodiment of the present disclosure.
Figure 9B:
FIG. 9B is a cross-sectional view schematically showing a process of forming a gate electrode in the method of manufacturing a thin-film semiconductor device according to the variation of the embodiment of the present disclosure.
Figure 9C:
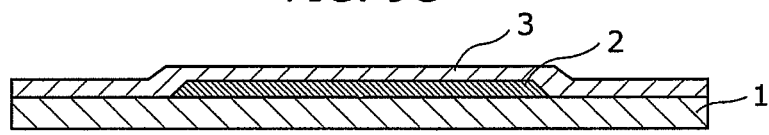
FIG. 9C is a cross-sectional view schematically showing a process of forming a gate insulating film in the method of manufacturing a thin-film semiconductor device according to the variation of the embodiment of the present disclosure.
Figure 9D:
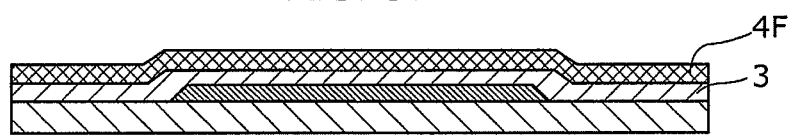
FIG. 9D is a cross-sectional view schematically showing a process of forming a polycrystalline semiconductor layer in the method of manufacturing a thin-film semiconductor device according to the variation of the embodiment of the present disclosure.

Next, a variation of the embodiment of the present disclosure is described. The present variation is different from the embodiment described above only in the manufacturing method, and therefore for the present variation hereinafter, only the manufacturing method will be described. FIGS. 9A to 9N are cross-sectional views each of which schematically shows a configuration of the thin-film semiconductor device in each process in the method of manufacturing the thin-film semiconductor device according to the embodiment of the present disclosure. Note that in FIGS. 9A to 9N, the same constituent elements as those shown in FIGS. 7A to 7O are assigned with the same reference signs.

As shown in FIGS. 9A to 9D, in the same manner as in FIGS. 7A to 7D, the gate electrode 2, the gate insulating film 3, and the polycrystalline semiconductor layer 4F are formed above the substrate 1.

Figure 9E:
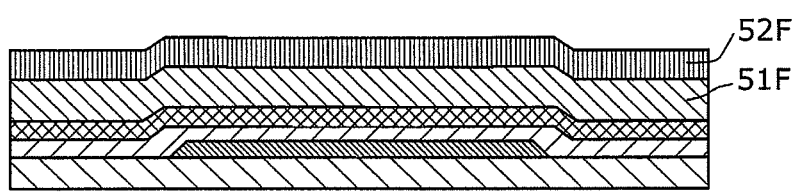
FIG. 9E is a cross-sectional view schematically showing a process of forming an amorphous semiconductor layer in the method of manufacturing a thin-film semiconductor device according to the variation of the embodiment of the present disclosure.
Figure 9F:
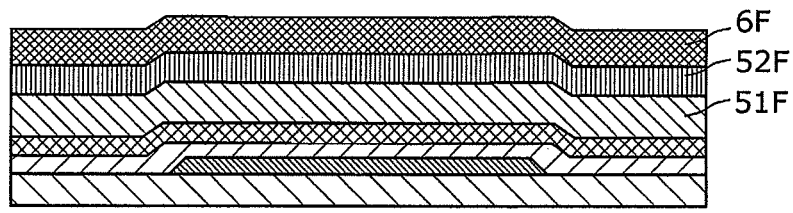
FIG. 9F is a cross-sectional view schematically showing a process of forming a film for forming an insulating layer in the method of manufacturing a thin-film semiconductor device according to the variation of the embodiment of the present disclosure.
Figure 9G:
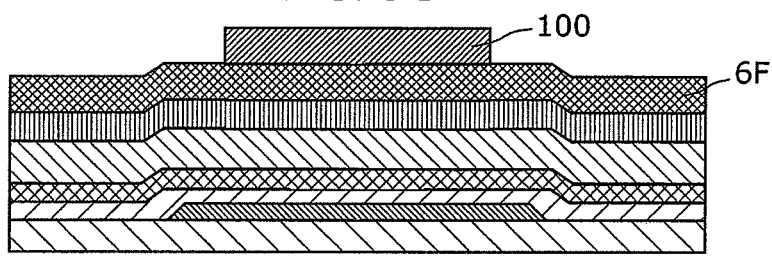
FIG. 9G is a cross-sectional view schematically showing a process of forming a resist in the method of manufacturing a thin-film semiconductor device according to the variation of the embodiment of the present disclosure.
Figure 9H:
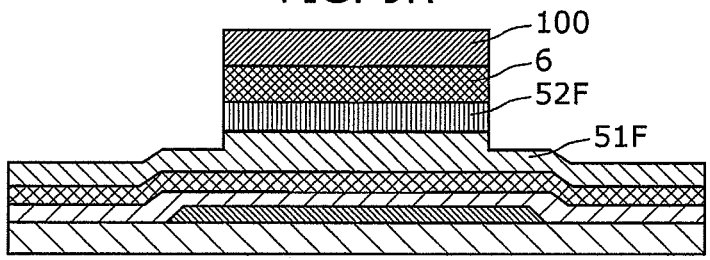
FIG. 9H is a cross-sectional view schematically showing a process of forming a projecting portion (etching process) in the method of manufacturing a thin-film semiconductor device according to the variation of the embodiment of the present disclosure.
Figure 9I:
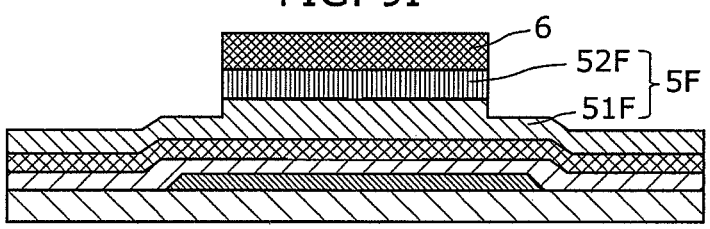
FIG. 9I is a cross-sectional view schematically showing a process of forming the projecting portion (resist removing process) in the method of manufacturing a thin-film semiconductor device according to the variation of the embodiment of the present disclosure.
Figure 9J:
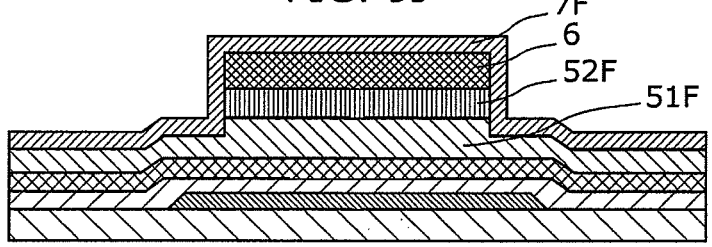
FIG. 9J is a cross-sectional view schematically showing a process of forming a film for a contact layer in the method of manufacturing a thin-film semiconductor device according to the variation of the embodiment of the present disclosure.
Figure 9K:
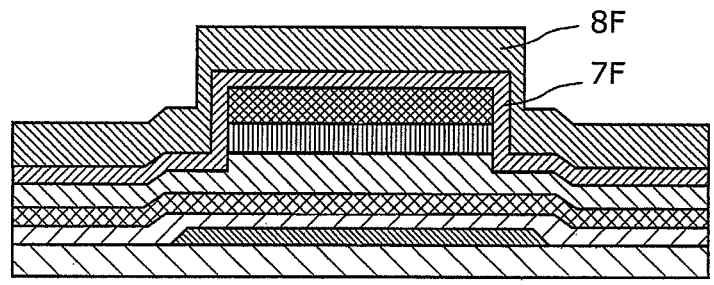
FIG. 9K is a cross-sectional view schematically showing a process of forming a source-drain metal film in the method of manufacturing a thin-film semiconductor device according to the variation of the embodiment of the present disclosure.
Figure 9L:
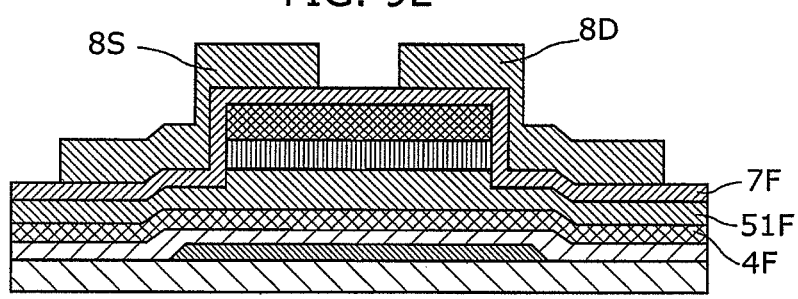
FIG. 9L is a cross-sectional view schematically showing a process of forming a source electrode and a drain electrode in the method of manufacturing a thin-film semiconductor device according to the variation of the embodiment of the present disclosure.
Figure 9M:
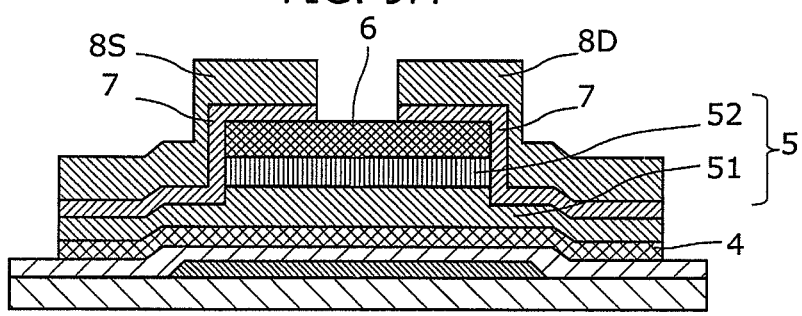
FIG. 9M is a cross-sectional view schematically showing a process of patterning the contact layer and the channel layer (islandization process) in the method of manufacturing a thin-film semiconductor device according to the variation of the embodiment of the present disclosure.
Figure 9N:
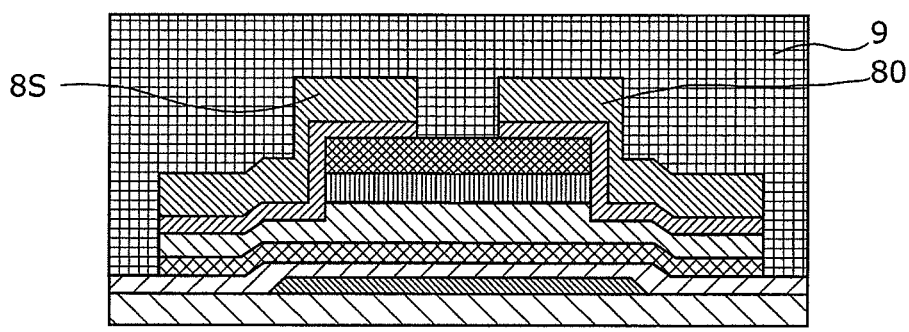
FIG. 9N is a cross-sectional view schematically showing a process of forming a passivation film in the method of manufacturing a thin-film semiconductor device according to the variation of the embodiment of the present disclosure.

Next, as shown in FIG. 9E, the amorphous semiconductor layer consisting of the first amorphous semiconductor layer 51F corresponding to the first portion 51 that is a low-resistance layer and the second amorphous semiconductor layer 52F corresponding to the second portion 52 that is a high-resistance layer is formed on the polycrystalline semiconductor layer 4F.

In the present embodiment, the first amorphous semiconductor layer 51F and the second amorphous semiconductor layer 52F are continuously formed according to the same film forming condition within the same vacuum apparatus. In other words, the first amorphous semiconductor layer 51F and the second amorphous semiconductor layer 52F are formed by forming each amorphous semiconductor layer under the same forming condition while maintaining a vacuum state. For example, after forming the polycrystalline semiconductor layer 4F, by forming, using the plasma CVD, the amorphous silicon film on the polycrystalline semiconductor layer 4F according to a predetermined film forming condition, it is possible to form an amorphous semiconductor layer including two regions, that is, amorphous silicon having the crystalline component (the first amorphous semiconductor layer 51F) and amorphous silicon formed only of the amorphous component (the second amorphous semiconductor layer 52F).

More specifically, for example, by forming the amorphous silicon film in contact with the polycrystalline semiconductor layer 4F by increasing RF power density to be larger than the RF power density in the condition for forming an amorphous silicon film in forming the polycrystalline semiconductor layer 4F or by lowering a film forming rate, the amorphous silicon film formed near the surface of the polycrystalline semiconductor layer 4F takes over the crystallinity of the polycrystalline semiconductor layer 4F and naturally becomes crystallized. Then, as the film formation progresses, the further the film is away from the polycrystalline semiconductor layer 4F, the smaller the crystallinity of the film becomes, and after the crystallinity becomes zero, the amorphous silicon film formed only of an amorphous component is formed. In other words, the amorphous silicon film formed near the surface of the polycrystalline semiconductor layer 4F becomes further crystallized on the polycrystalline semiconductor layer 4F that is an underlayer, and the crystallinity of the lower layer (the first amorphous semiconductor layer 51F) naturally grows higher than the crystallinity of the upper layer (the second amorphous semiconductor layer 52F), thus forming the amorphous semiconductor layer. This allows forming an amorphous semiconductor layer including a low-resistance lower layer and a high-resistance upper layer. Note that the amorphous semiconductor layer according to the present embodiment can be considered as a single film consisting of two layers different in crystallinity, that is, two layers different in resistivity.

Next, as shown in FIGS. 9F to 9N, by performing each process in the same manner as in FIGS. 7G to 7O, it is possible to manufacture the thin-film semiconductor device according to the present variation.

Next, an example of application, to a display apparatus, of the thin-film semiconductor device 10 according to the embodiment described above will be described with reference to FIG. 10. Note that in the present embodiment, the example of application to an organic EL display apparatus will be described.

Figure 10:
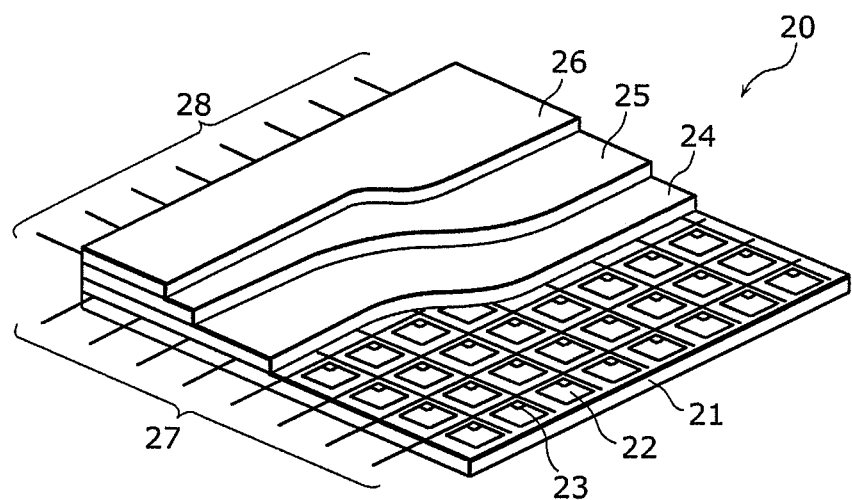
FIG. 10 is a partially cutaway perspective view of an organic electroluminescence (EL) display apparatus according to the embodiment of the present disclosure.

FIG. 10 is a partially cutaway perspective view of an organic EL display apparatus according to the embodiment of the present disclosure. The thin-film semiconductor device 10 as described above can be used as a switching transistor or a driving transistor for an active matrix substrate in the organic EL display apparatus.

As shown in FIG. 10, an organic EL display apparatus 20 includes: an active matrix substrate (TFT array substrate) 21; pixels 22 arranged in a matrix in the active matrix substrate 21; pixel circuits 23 connected to the pixels 22 and arranged in an array on the active matrix substrate 21; an anode 24, an organic EL layer 25, and a cathode 26 (transparent electrode) that are serially stacked on the pixels 22 and the pixel circuits 23; and source lines 27 and gate lines 28 connecting the respective pixel circuits 23 and a control circuit (not shown). The organic EL layer 25 is formed by stacking different layers such as an electron transport layer, a luminescent layer, and a hole transport layer.

Figure 11:
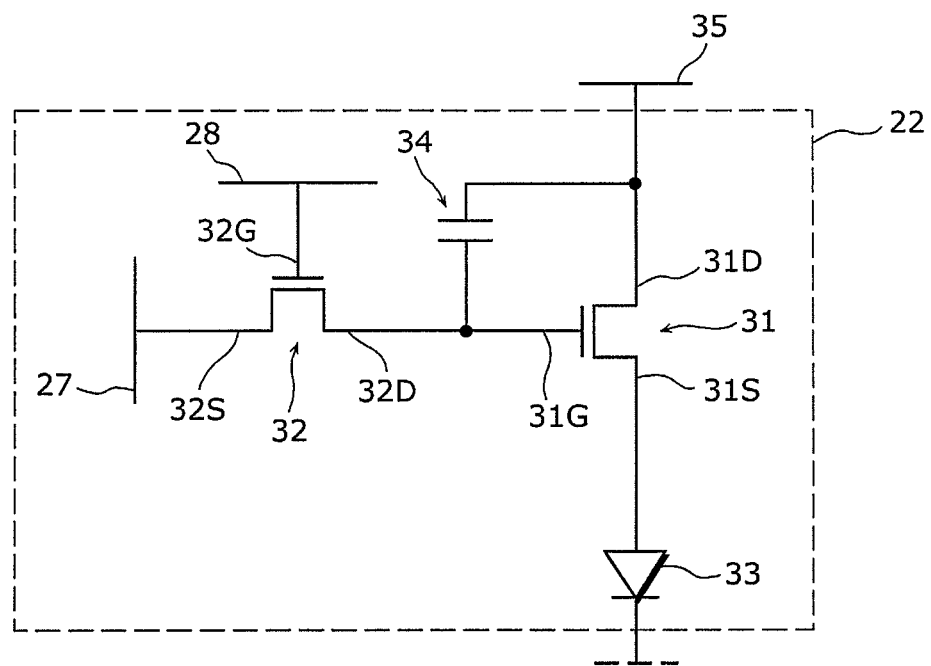
FIG. 11 is a diagram showing a circuit configuration of a pixel using the thin-film semiconductor device according to the embodiment of the present disclosure.

Next, a circuit configuration of the pixel 22 in the organic EL display apparatus 20 described above will be described with reference to FIG. 11. FIG. 11 is a diagram showing a circuit configuration of a pixel using the thin-film semiconductor device according to the embodiment of the present disclosure.

As shown in FIG. 11, the pixel 22 includes: a driving transistor 31, a switching transistor 32, an organic EL device 33, and a condenser 34. The driving transistor 31 is a transistor that drives the organic EL device 33, and the switching transistor 32 is a transistor for selecting the pixel 22.

A source electrode 32S of the switching transistor 32 is connected to the source line 27, a gate electrode 32G is connected to a gate line 28, and a drain electrode 32D is connected to the condenser 34 and a gate electrode 31G of the drive transistor 31.

In addition, the drain electrode 31D of the drive transistor 31 is connected to a power line 35, and a source electrode 31S is connected to an anode of the organic EL device 33.

In this configuration, when a gate signal is input into the gate line 28 to turn the switching TFT 32 into an ON state, a signal voltage supplied via the source line 27 is written into the condenser 34. Then, a held voltage, which is the voltage written into the condenser 34, is held through one frame period. This held voltage causes analog change in conductance of the driving TFT 31, so that a drive current corresponding to luminescence levels flows from the anode to the cathode of the organic EL device 33. With this, the organic EL device 33 produces luminescence, so that a predetermined image can be displayed.

Note that in the present embodiment, the organic EL display apparatus using the organic EL device has been described, but the organic EL device is also applicable to another display apparatus using an active matrix substrate, such as a liquid crystal display apparatus. In addition, the display apparatus thus configured can also be used as a flat panel display, and is also applicable to any electronic device including a display panel, such as a television set, a personal computer, and a cellular phone.

As described thus far, the thin-film semiconductor device and the method of manufacturing the thin-film semiconductor device according to the present disclosure have been described, but the thin-film semiconductor device and the manufacturing method thereof according to the present disclosure are not necessarily determined by the embodiment and the variation as described above.

For example, in the embodiment of the present disclosure described above, the thin-film semiconductor device of the channel protection type using the insulating layer 6 (channel protection film) has been described, but the present disclosure is also applicable to a thin-film semiconductor device of a channel etching type which does not use the insulating layer 6 (channel protection film). Even in the thin-film semiconductor device of the channel etching type, a positive fixed charge exists in the channel layer due to the passivation film on the source and drain electrodes or a damage caused by dry etching performed on the channel layer. Therefore, even in the thin-film semiconductor device of the channel etching type, it is possible to suppress the leakage current in the back channel by forming the first portion that is the upper layer in the amorphous semiconductor layer into an amorphous silicon film having high resistance. In addition, by forming the amorphous semiconductor layer in a cross-sectional projecting shape and removing the high-resistance amorphous silicon film so as to leave only the low-resistance amorphous silicon film, it is possible to reduce the transverse resistance at the front channel, thus achieving an increase in the ON current.

Other than this, those skilled in the art will readily appreciate that many modifications are possible in the exemplary embodiment without materially departing from the novel teachings and advantages of this disclosure. Accordingly, all such modifications are intended to be included within the scope of this disclosure.

Industrial Applicability

A thin-film semiconductor device according to an implementation of the present disclosure is widely applicable to a display apparatus such as a television set, a personal computer, and a cellular phone or other different electronic devices.

The invention claimed is:

1. A thin-film semiconductor device, comprising:
a substrate;
a gate electrode formed above the substrate;
a gate insulating film formed on the gate electrode;
a channel layer formed of a polycrystalline semiconductor layer on the gate insulating film;
an amorphous semiconductor layer formed on the channel layer and having a projecting portion in a surface thereof; and
a source electrode and a drain electrode that are formed above the amorphous semiconductor layer, wherein a first portion included in the amorphous semiconductor layer and located closer to the channel layer has a resistivity lower than a resistivity of a second portion included in the amorphous semiconductor layer and located closer to the source electrode and the drain electrode
the amorphous semiconductor layer comprises a flat portion and the projecting portion, the second portion of the amorphous semiconductor layer comprises a top portion of the projecting portion, and
the first portion of the amorphous semiconductor layer comprises a lower portion of the projecting portion and the flat portion,
wherein the projecting portion comprises a single projection, and the flat portion extends laterally from the projecting portion.

2. The thin-film semiconductor device according to claim 1,
wherein the first portion has an optical bandgap of 1.63 eV or more, and
the second portion has an optical bandgap of 1.60 eV or less.

3. The thin-film semiconductor device according to claim 1,
wherein the first portion has a refractive index of 4.2 or less, and
the second portion has a refractive index of 4.3 or more.

4. The thin-film semiconductor device according to claim 1,
wherein the first portion has an extinction coefficient of 0.11 or less, and
the second portion has an extinction coefficient of 0.12 or more.

5. The thin-film semiconductor device according to claim 1,
wherein the first portion contains hydrogen at a concentration of 13% or more, and
the second portion contains hydrogen at a concentration of 9% or less.

6. The thin-film semiconductor device according to claim 1,
wherein the amorphous semiconductor layer has a stacked structure consisting of a layer corresponding to the second portion and a layer corresponding to the first portion, and
the layer corresponding to the second portion is formed on the layer corresponding to the second portion is formed on the layer corresponding to the first potion.

7. The thin-film semiconductor device according to claim 1,
wherein the first portion is formed of an amorphous semiconductor containing a microcrystal component, and
the second portion is formed of an amorphous semiconductor having a noncrystalline structure.

8. The thin-film semiconductor device according to claim 1,
wherein a portion at a bottom of each of sides of the projecting portion in the amorphous semiconductor layer is a charge transfer path between the channel layer and one of the source electrode and the drain electrode.

9. The thin-film semiconductor device according to claim 1, further comprising
an insulating layer formed on a top surface of the projecting portion in the amorphous semiconductor layer.

10. The thin-film semiconductor device according to claim 9,
wherein the insulating layer has the same width as the top surface of the projecting portion in the amorphous semiconductor layer.

11. The thin-film semiconductor device according to claim 9, further comprising
a pair of contact layers each formed on:
a top surface of the insulating layer;
a side surface of the insulating layer;
a side surface included in the projecting portion in the amorphous semiconductor layer; and
a top surface of the amorphous semiconductor layer,
wherein the source electrode is formed above one of the pair of contact layers, and
the drain electrode is formed above the other of the pair of contact layers.

12. The thin-film semiconductor device according to claim 1,
wherein the polycrystalline semiconductor layer is made of polycrystalline silicon, and
the amorphous semiconductor layer is made of amorphous silicon.

13. The thin-film semiconductor device according to claim 1,
wherein the polycrystalline semiconductor layer includes a microcrystalline semiconductor layer having an average grain size of 20 nm or more and less than 40 nm.

14. The thin-film semiconductor device according to claim 1,
wherein the amorphous semiconductor layer includes a microcrystalline semiconductor layer having an average grain size of 20 nm or more and less than 40 nm.

15. The thin-film semiconductor device according to claim 1,
wherein the second portion in the amorphous semiconductor layer has a film thickness of 20 nm or more, the second portion being located closer to the source electrode and the drain electrode.

16. The thin-film semiconductor device according to claim 1, a periphery of the flat portion is outwards of a periphery of the gate electrode.

17. The thin-film semiconductor device according to claim 1, a periphery of the projecting portion is within a periphery of the gate electrode.

18. A method of manufacturing a thin-film semiconductor device, comprising:
preparing a substrate;
forming a gate electrode above the substrate;
forming a gate insulating film on the gate electrode;
forming a channel layer on the gate insulating film, the channel layer being formed of a polycrystalline semiconductor layer;
forming an amorphous semiconductor layer on the channel layer, the amorphous semiconductor layer having a projecting portion in a surface thereof; and
forming a source electrode and a drain electrode above the amorphous semiconductor layer,
wherein the amorphous semiconductor layer is formed such that a first portion located closer to the channel layer has a resistivity lower than a resistivity of a second portion located closer to the source electrode and the drain electrode,
the amorphous semiconductor layer comprises a flat portion and the projecting portion,
the second portion of the amorphous semiconductor layer comprises a top portion of the projecting portion, and
the first portion of the amorphous semiconductor layer comprises a lower portion of the projecting portion and the flat portion,
wherein the projecting portion comprises a single projection, and the flat portion extends laterally from the projecting portion.

19. The method of manufacturing a thin-film semiconductor device according to claim 18,
wherein the amorphous semiconductor layer is formed on the polycrystalline semiconductor layer so that a crystal grain is mixed in the first portion in the amorphous semiconductor layer.

20. The method of manufacturing a thin-film semiconductor device according to claim 19,
wherein an average size of the crystal grain is 20 nm or more and less than 40 nm.

21. The method of manufacturing a thin-film semiconductor device according to claim 18,
wherein the amorphous semiconductor layer is formed under the same forming condition so that the first portion and the second portion are continuously formed.

22. The method of manufacturing a thin-film semiconductor device according to claim 18,
wherein the first portion is formed under a first forming condition, and
the second portion is formed under a second forming condition different from the first forming condition.

23. The method of manufacturing a thin-film semiconductor device according to claim 18, further comprising
forming an insulating layer on a top surface of the projecting portion in the amorphous semiconductor layer, between the forming of an amorphous semiconductor layer and the forming of a source electrode and a drain electrode.

* * * * *